US009691891B2

(12) United States Patent
Masuda

(10) Patent No.: US 9,691,891 B2
(45) Date of Patent: Jun. 27, 2017

(54) WIDE BAND GAP SEMICONDUCTOR DEVICE

(71) Applicant: Sumitomo Electric Industries, Ltd., Osaka-shi (JP)

(72) Inventor: Takeyoshi Masuda, Osaka (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

(21) Appl. No.: 14/909,015

(22) PCT Filed: Jun. 18, 2014

(86) PCT No.: PCT/JP2014/066113
§ 371 (c)(1),
(2) Date: Jan. 29, 2016

(87) PCT Pub. No.: WO2015/015934
PCT Pub. Date: Feb. 5, 2015

(65) Prior Publication Data
US 2016/0181415 A1    Jun. 23, 2016

(30) Foreign Application Priority Data

Aug. 1, 2013    (JP) .................................. 2013-160609

(51) Int. Cl.
*H01L 29/15*     (2006.01)
*H01L 31/0312*   (2006.01)
(Continued)

(52) U.S. Cl.
CPC ........ *H01L 29/7811* (2013.01); *H01L 29/045* (2013.01); *H01L 29/0611* (2013.01);
(Continued)

(58) Field of Classification Search
CPC ............. H01L 29/7811; H01L 29/0619; H01L 29/66068; H01L 29/7813; H01L 29/0611;
(Continued)

(56) References Cited

U.S. PATENT DOCUMENTS 6,218,254 B1 *    4/2001   Singh ................ H01L 29/66068
                                                       257/E21.066
2011/0018005 A1   1/2011   Nakano
(Continued)

FOREIGN PATENT DOCUMENTS

JP    H11-87698 A      3/1999
JP    2010-225833 A    10/2010
(Continued)

OTHER PUBLICATIONS

International Search Report in International Application No. PCT/JP2014/066113, dated Sep. 9, 2014.

*Primary Examiner* — Victor A Mandala
(74) *Attorney, Agent, or Firm* — Venable LLP; Michael A. Sartori; F. Brock Riggs

(57) ABSTRACT

A semiconductor substrate having a main surface and made of a wide band gap semiconductor is provided, the semiconductor substrate including a device region formed in the semiconductor substrate, and a peripheral region formed to surround the device region. In the peripheral region, the semiconductor substrate includes a first semiconductor region having a first conductivity type, and a second semiconductor region formed on the first semiconductor region and having the main surface, the second semiconductor region having a second conductivity type different from the first conductivity type. At an outermost periphery of the peripheral region, the semiconductor substrate has a plural- (Continued)

ity of stepped portions annularly surrounding the device region, and the second semiconductor region is formed along the stepped portion.

11 Claims, 17 Drawing Sheets

(51) Int. Cl.
    H01L 29/78      (2006.01)
    H01L 29/16      (2006.01)
    H01L 29/66      (2006.01)
    H01L 29/04      (2006.01)
    H01L 29/06      (2006.01)
    H01L 29/423     (2006.01)
(52) U.S. Cl.
    CPC ...... *H01L 29/0619* (2013.01); *H01L 29/1608* (2013.01); *H01L 29/66068* (2013.01); *H01L 29/7813* (2013.01); *H01L 29/0615* (2013.01); *H01L 29/4236* (2013.01)
(58) Field of Classification Search
    CPC ............... H01L 29/045; H01L 29/1608; H01L 29/4236; H01L 29/0615
    See application file for complete search history.

(56) References Cited

U.S. PATENT DOCUMENTS

| | | | | |
|---|---|---|---|---|
| 2012/0256195 | A1* | 10/2012 | Aketa | H01L 29/1608 257/77 |
| 2012/0326207 | A1* | 12/2012 | Yoshimochi | H01L 29/866 257/139 |
| 2013/0020611 | A1* | 1/2013 | Gumaelius | H01L 21/3065 257/183 |
| 2013/0277688 | A1 | 10/2013 | Nakano | |
| 2013/0288467 | A1 | 10/2013 | Ebiike et al. | |
| 2014/0145212 | A1 | 5/2014 | Takeuchi et al. | |
| 2014/0203393 | A1* | 7/2014 | Kawakami | H01L 29/8611 257/471 |
| 2015/0255535 | A1* | 9/2015 | Taguchi | H01L 29/7395 257/488 |

FOREIGN PATENT DOCUMENTS

| | | | | |
|---|---|---|---|---|
| JP | 2011-44688 | A | 3/2011 | |
| JP | 2013-012568 | A | 1/2013 | |
| WO | WO-2012/096010 | A1 | 7/2012 | |
| WO | WO-2013/021636 | * | 2/2013 | ............... 29/78 |
| WO | WO-2013/021636 | A1 | 2/2013 | |

\* cited by examiner

WIDE BAND GAP SEMICONDUCTOR DEVICE

TECHNICAL FIELD

The present invention relates to wide band gap semiconductor devices, and more particularly to a wide band gap semiconductor device having a peripheral region.

BACKGROUND ART

In recent years, silicon carbide has been increasingly employed as a material forming a semiconductor device such as a MOSFET (Metal Oxide Semiconductor Field Effect Transistor) in order to allow for higher breakdown voltage, lower loss, the use in a high-temperature environment and the like of the semiconductor device. Silicon carbide is a wide band gap semiconductor having a band gap wider than that of silicon which has been conventionally and widely used as a material forming a semiconductor device. By employing the silicon carbide as a material forming a semiconductor device, therefore, higher breakdown voltage, lower on-resistance and the like of the semiconductor device can be achieved. A semiconductor device made of silicon carbide is also advantageous in that performance degradation is small when used in a high-temperature environment as compared to a semiconductor device made of silicon.

One of known methods to achieve a higher breakdown voltage of a semiconductor device is to provide a plurality of guard rings concentrically to surround an element region, with the impurity concentration decreasing toward outer guard ring regions.

Japanese Patent Laying-Open No. 2011-44688 describes a semiconductor device having a peripheral region (terminal region) in which a plurality of p type guard rings are formed at a distance from an active region. Each guard ring is a floating guard ring formed in a surface layer portion of an epitaxial layer, and is covered with a gate insulating film and an interlayer insulating film.

CITATION LIST

Patent Document

PTD 1: Japanese Patent Laying-Open No. 2011-44688

SUMMARY OF INVENTION

Technical Problem

In order to achieve an even higher breakdown voltage of the semiconductor device using the guard ring structure described in Japanese Patent Laying-Open No. 2011-44688, however, the size of the peripheral region (terminal region) in which the guard rings are formed needs to be increased. In this case, in order to maintain the size of a semiconductor element region (device region), the size of the semiconductor device itself needs to be increased. Unfortunately, such increase in size of the semiconductor device results in increased costs to manufacture the semiconductor device.

The present invention has been made to solve the problem as described above. A main object of the present invention is to provide a wide band gap semiconductor device capable of achieving a higher breakdown voltage without an increase in size.

Solution to Problem

A wide band gap semiconductor device according to the present invention includes a semiconductor substrate having a main surface and made of a wide band gap semiconductor, a device region formed in the semiconductor substrate, and a peripheral region formed to surround the device region, in the peripheral region, the semiconductor substrate including a first semiconductor region having a first conductivity type, and a second semiconductor region formed on the first semiconductor region and having the main surface, the second semiconductor region having a conductivity type different from the first conductivity type, at an outermost periphery of the peripheral region, the semiconductor substrate having a plurality of stepped portions annularly surrounding the device region, the second semiconductor region being formed along the stepped portions.

Advantageous Effects of Invention

According to the present invention, a wide band gap semiconductor device capable of achieving a higher breakdown voltage can be provided without an increase in size.

DESCRIPTION OF EMBODIMENTS

Figure 1:
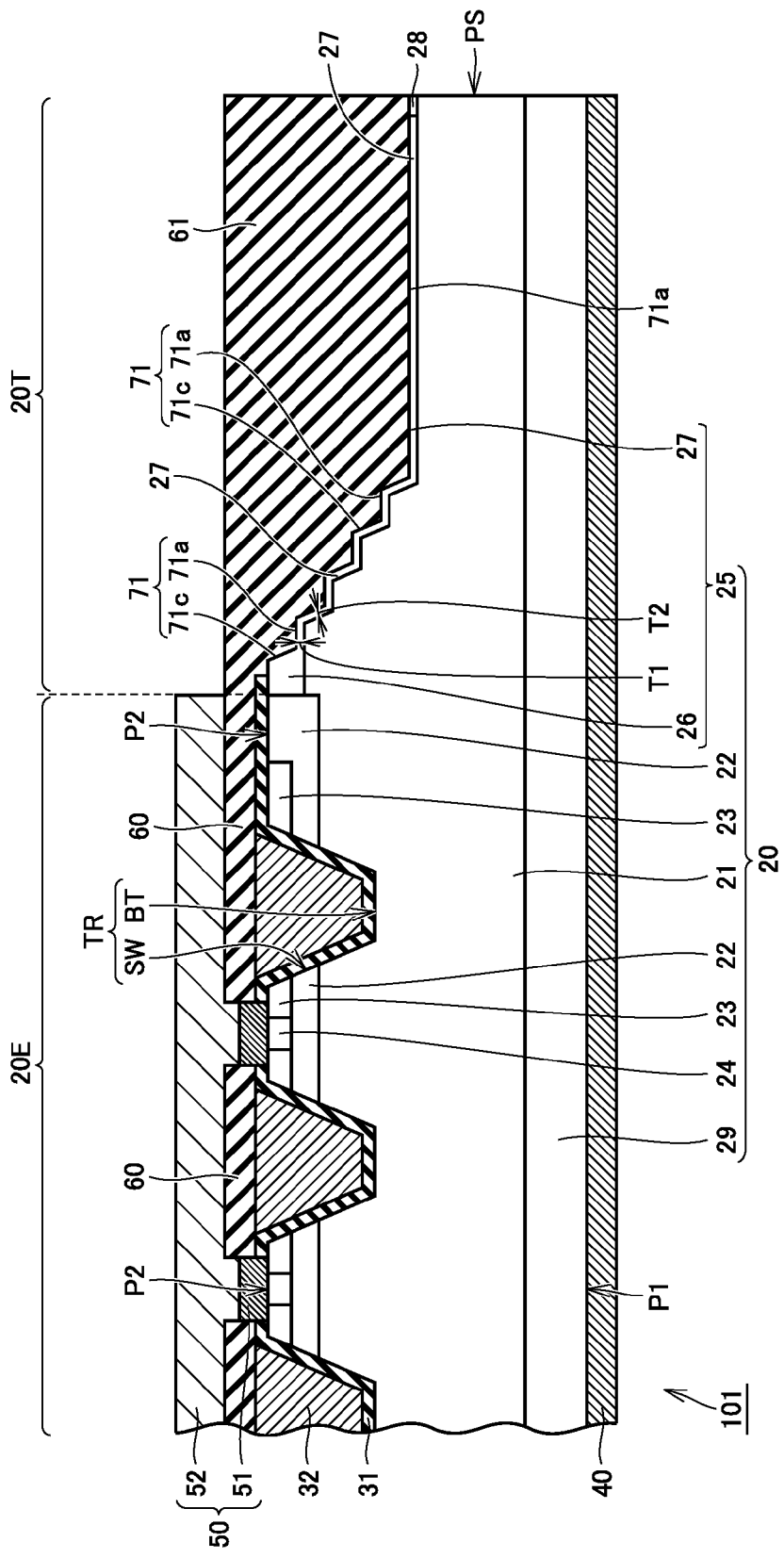
FIG. 1 is a cross-sectional view of a wide band gap semiconductor device according to a first embodiment.

Embodiments of the present invention will be described below with reference to the drawings. In the following drawings, the same or corresponding parts are designated by the same reference numbers and description thereof will not be repeated. Regarding crystallographic denotation herein, an individual orientation, a group orientation, an individual plane, and a group plane are shown in [ ], < >, ( ), and { }, respectively. Although a crystallographically negative index is normally expressed by a number with a bar "−" thereabove, a negative sign herein precedes a number to indicate a crystallographically negative index. In expressing an angle, a system in which a total azimuth angle is defined as 360 degrees is employed.

DESCRIPTION OF EMBODIMENTS OF THE PRESENT INVENTION

A summary of embodiments of the present invention will be initially described.

(1) A wide band gap semiconductor device according to this embodiment includes a semiconductor substrate (epitaxial substrate 20) having a main surface (upper surface P2) and made of a wide band gap semiconductor, semiconductor substrate 20 including a device region 20E formed in semiconductor substrate 20, and a peripheral region 20T formed to surround device region 20E. In peripheral region 20T, semiconductor substrate 20 includes a first semiconductor region (drift layer 21) having a first conductivity type, and a second semiconductor region (electric field relaxing region 25) formed on the first semiconductor region (drift layer 21) and having main surface P2, the second semiconductor region having a second conductivity type different from the first conductivity type. At an outermost periphery of peripheral region 20T, semiconductor substrate 20 has stepped portions 71 annularly surrounding device region 20E, and the second semiconductor region is formed along stepped portions 71.

Consequently, since the plurality of stepped portions 71 annularly surrounding device region 20E are formed in peripheral region 20T, a creepage distance of the main surface (upper surface P2) can be increased in a direction from device region 20E toward an outer peripheral end of the wide band gap semiconductor device. That is, the creepage distance of main surface P2 in peripheral region 20T can be increased without an increase in spatial distance of peripheral region 20T (the shortest straight-line distance from device region 20E to the outer peripheral end of the wide band gap semiconductor device). In addition, when a high voltage is applied to the wide band gap semiconductor device, a depletion layer is formed at an interface between the first semiconductor region and the second semiconductor region in peripheral region 20T. As a result, the wide band gap semiconductor device according to this embodiment can achieve a higher breakdown voltage without an increase in size.

(2) In the wide band gap semiconductor device according to this embodiment, stepped portions 71 may each have an upper surface (terrace surface 71a) extending in a direction along the main surface (upper surface P2), and an inclined surface (step surface 71c) with respect to the main surface (upper surface P2), and a thickness T1 of the second semiconductor region on inclined surface 71c (see FIG. 1) may be greater than a thickness T2 of the second semiconductor region (electric field relaxing region 25) on inclined surface 71c (see FIG. 1).

Thus, at the interface between the first semiconductor region (drift layer 21) and the second semiconductor region (electric field relaxing region 25), a depletion layer can be readily expanded in a direction perpendicular to the main surface (upper surface P2). Thus, depletion layers formed at the interface between first semiconductor region 21 and second semiconductor region 25 formed along the plurality of stepped portions 71 on first semiconductor region 21 can be connected together in a direction parallel to the main surface (upper surface P2) as well, allowing for the formation of a large depletion layer in peripheral region 20T in both directions parallel to and perpendicular to the main surface (upper surface P2). As a result, the breakdown voltage of the wide band gap semiconductor device can be more effectively improved.

(3) In the wide band gap semiconductor device according to this embodiment, a plurality of the stepped portions (71) may be formed, and the plurality of stepped portions (71) may be formed in a step-like manner such that their depth in a direction perpendicular to the main surface (upper surface P2) increases as the distance to an outer periphery of the peripheral region (20T) decreases. Again in this case, the creepage distance of main surface P2 in peripheral region 20T can be increased without an increase in spatial distance of peripheral region 20T (the shortest straight-line distance from device region 20E to the outer peripheral end of the wide band gap semiconductor device). In addition, when a high voltage is applied to the wide band gap semiconductor device, a depletion layer is formed at the interface between the first semiconductor region and the second semiconductor region in peripheral region 20T. As a result, the wide band gap semiconductor device according to this embodiment can achieve a higher breakdown voltage without an increase in size.

(4) In the wide band gap semiconductor device according to this embodiment, a dielectric layer 61 may be formed on stepped portions 71, and the second semiconductor region (electric field relaxing region 25) may be formed to be sandwiched between the first semiconductor region (drift layer 21) and dielectric layer 61 in stepped portions 71.

Consequently, dielectric layer 61 can protect the second semiconductor region (electric field relaxing region 25), and more effectively relax electric field concentration in semiconductor substrate 20 and at the interface between semiconductor substrate 20 and dielectric layer 61 in peripheral region 20T. In addition, if the plurality of stepped portions 71 are formed in a step-like manner as described above, that is, if the plurality of stepped portions 71 are formed toward lower surface P1 as the distance to the outer periphery decreases, an end portion of second semiconductor region 25 that is located close to the outer periphery of the wide band gap semiconductor device (outermost peripheral end of second semiconductor region 25) is formed in a position closer to lower surface P1, which is located opposite to the main surface (upper surface P2), than the other portions of second semiconductor region 25. In this case, since dielectric layer 61 is formed to fill stepped portions 71, dielectric layer 61 is formed such that its thickness increases from a portion over the end portion of second semiconductor region 25 that is located close to device region 20E (innermost peripheral end of second semiconductor region 25) toward a portion over the outermost peripheral end of second semiconductor region 25. Accordingly, the wide band gap semiconductor device according to this embodiment can relax electric field concentration close to the outer periphery of peripheral region 20T where electric field concentration tends to occur upon application of a high voltage in a common semiconductor device having a guard ring structure. Further, since dielectric layer 61 is formed such that its thickness increases as the distance to the outer periphery of peripheral region 20T decreases, the potential on the surface of dielectric layer 61 located close to the outer periphery of peripheral region 20T can be lowered. As a result, the wide band gap semiconductor device according to this embodiment can lower the risk of occurrence of discharge on dielectric layer 61.

(5) In the wide band gap semiconductor device according to this embodiment, a material forming dielectric layer 61 may include at least one selected from the group consisting of silicon dioxide, polyimide, and silicon nitride. Again in this case, a depletion layer readily expands from the interface between the first semiconductor region (drift layer 21) and the second semiconductor region (electric field relaxing region 25), so that electric field concentration in semiconductor substrate 20 and at the interface between semiconductor substrate 20 and dielectric layer 61 can be relaxed to improve the breakdown voltage of the wide band gap semiconductor device.

(6) In peripheral region 20T of the wide band gap semiconductor device according to this embodiment, a plurality of peripheral region trenches (70) annularly surrounding the device region (20E) may be formed in the main surface (upper surface P2) of the second semiconductor region (25) located on an inner side relative to the stepped portions (71).

Consequently, since the plurality of peripheral region trenches 70 are formed, the creepage distance of the main surface (upper surface P2) can be further increased in the direction from device region 20E toward the outer peripheral end of the wide band gap semiconductor device, without an increase in spatial distance of peripheral region 20T (the shortest straight-line distance from device region 20E to the outer peripheral end of the wide band gap semiconductor device). As a result, the wide band gap semiconductor device according to this embodiment can achieve a higher breakdown voltage without an increase in size.

(7) In the wide band gap semiconductor device according to this embodiment, peripheral region trenches 70 may be formed in the second semiconductor region (electric field relaxing region 25). That is, the second semiconductor region (electric field relaxing region 25) is provided without being divided by peripheral region trenches 70. Accordingly, a depletion layer readily expands in a direction in which the interface between the first semiconductor region (drift layer 21) and second semiconductor region 25 extends, namely, in the direction parallel to main surface P2. As a result, electric field concentration in the vicinity of device region 20E and in peripheral region 20T can be effectively relaxed, thereby improving the breakdown voltage of the wide band gap semiconductor device. Further, since second semiconductor region 25 is provided without being divided by peripheral region trenches 70, the entire second semiconductor region 25 (a JTE region 26 and a guard ring region 27 in FIG. 8) can be source-grounded by connecting second semiconductor region 25 to source region 23 on the side close to device region 20E, for example. As a result, when a voltage is applied between the source and drain resulting in depletion of the interface between first semiconductor region 21 and second semiconductor region 25, and then the application of the voltage is suspended, for example, conductive ions (carriers) in second semiconductor region 25 can be quickly recovered. Thus, ON operation of the wide band gap semiconductor device can be effected in a state where the conductive ions in second semiconductor region 25 have been reliably recovered, thereby suppressing characteristic variation during the ON operation.

(8) In the wide band gap semiconductor device according to this embodiment, a sidewall of each of peripheral region trenches 70 may extend from the second semiconductor region (electric field relaxing region 25) to the first semiconductor region (drift layer 21).

Again in this case, since the plurality of peripheral region trenches 70 are formed, the creepage distance of the main surface (upper surface P2) can be increased in the direction from device region 20E toward the outer peripheral end of the wide band gap semiconductor device, without an increase in spatial distance of peripheral region 20T (the shortest straight-line distance from device region 20E to the outer peripheral end of the wide band gap semiconductor device). As a result, the wide band gap semiconductor device according to this embodiment can achieve a higher breakdown voltage without an increase in size.

(9) In the device region of the wide band gap semiconductor device according to this embodiment, a device trench TR may be provided in the main surface (upper surface P2) of the semiconductor substrate (20), a width of each of peripheral region trenches 70 in a direction perpendicular to a direction in which peripheral region trench 70 extends may be smaller than a width of device trench TR at the main surface (P2) in a direction perpendicular to a direction in which device trench TR extends, and a depth of each of peripheral region trenches 70 in a direction perpendicular to the main surface (upper surface P2) may be smaller than a depth of device trench TR in the direction perpendicular to the main surface (upper surface P2).

That is, in the trench type wide band gap semiconductor device in which device trench TR is formed in device region 20E, the width of peripheral region trench 70 in the direction perpendicular to the direction in which peripheral region trench 70 extends may be smaller than the width of device trench TR in the direction in which device trench TR extends. Further, the depth of peripheral region trench 70 in the direction perpendicular to the main surface (upper surface P2) may be smaller than the depth of device trench TR in the direction perpendicular to the main surface. Consequently, since the width of peripheral region trench 70 is sufficiently narrow, spacing between depletion layers expanding from the second semiconductor regions (electric field relaxing regions 25) facing each other with peripheral region trench 70 interposed therebetween toward the first semiconductor region (drift layer 21) can be reduced in the direction perpendicular to the direction in which peripheral region trench 70 extends, or the depletion layers can be expanded such that they are connected together while extending over peripheral region trench 70. As a result, electric field concentration in the vicinity of device region 20E and in peripheral region 20T can be relaxed to improve the breakdown voltage of the wide band gap semiconductor device.

(10) In the device region of the wide band gap semiconductor device according to this embodiment, the semiconductor substrate may include the first semiconductor region (drift layer 21) having the main surface (upper surface P2), a pair of third semiconductor regions (body regions 22) spaced apart from and facing each other at main surface P2, the third semiconductor regions having the second conductivity type, and a fourth semiconductor region having the first conductivity type in each of the pair of third semiconductor regions (body regions 22), a width of each of peripheral region trenches 70 at the main surface (P2) in a direction perpendicular to a direction in which peripheral region trench 70 extends may be smaller than spacing between the third semiconductor regions (p body regions 22) facing each other with the first semiconductor region interposed therebetween at the main surface (P2), and a depth of each of peripheral region trenches 70 in a direction perpendicular to the main surface may be smaller than a depth of a bottom of each of the third semiconductor regions (p body regions 22) from the main surface.

That is, in the planar type wide band gap semiconductor device, the width of peripheral region trench 70 in the direction perpendicular to the direction in which peripheral region trench 70 extends may be smaller than the spacing between the pair of third semiconductor regions (p body regions 22) facing each other with the first semiconductor region interposed therebetween. Further, the depth of peripheral region trench 70 in the direction perpendicular to the main surface (upper surface P2) may be smaller than the depth of the bottom of third semiconductor region 22 from the main surface. Consequently, since the width of peripheral region trench 70 is sufficiently narrow, spacing between depletion layers expanding from the second semiconductor regions (electric field relaxing regions 25) facing each other with peripheral region trench 70 interposed therebetween toward the first semiconductor region (drift layer 21) can be reduced in the direction perpendicular to the direction in which peripheral region trench 70 extends, or the depletion layers can be readily expanded such that they are connected together while extending over peripheral region trench 70. As a result, electric field concentration in the vicinity of device region 20E and in peripheral region 20T can be relaxed to improve the breakdown voltage of the wide band gap semiconductor device.

(11) In the wide band gap semiconductor device according to this embodiment, a sidewall of each of peripheral region trenches 70 may be inclined with respect to the main surface (upper surface P2). In this case, the second semiconductor region (electric field relaxing region 25) can reduce the spacing between thick portions 27a more on the side close to the interface with the first semiconductor region (drift layer 21) than on the side close to main surface P2. Thus, particularly when the second semiconductor region (electric field relaxing region 25) is divided into a plurality of portions by peripheral region trench 70, depletion layers extending from an interface between each thick portion 27a and first semiconductor region 21 can readily expand so that they are connected together by extending over peripheral region trench 70. Further, peripheral region trench 70 having the sidewall inclined with respect to main surface P2 can be formed by forming a trench having a sidewall perpendicular to main surface P2 by dry etching, for example, then removing by wet etching or the like a process damaged layer generated by the dry etching. This can suppress the occurrence of variation in the way a depletion layer expands due to the formation of a process damaged layer in second semiconductor region 25.

(12) In the wide band gap semiconductor device according to this embodiment, the first conductivity type may be n type, and the second conductivity type may be p type. Again in this case, a pn junction surface is formed at the interface between the first semiconductor region (drift layer 21) having the first conductivity type and the second semiconductor region (electric field relaxing region 25) having the second conductivity type. Thus, a depletion layer can be formed in peripheral region 20T to improve the breakdown voltage of the wide band gap semiconductor device.

It is noted that in the wide band gap semiconductor device according to this embodiment, the semiconductor substrate may be an epitaxial substrate in which an epitaxial layer is formed on a base substrate such as a single-crystal substrate, or may be an epitaxial layer in which a base substrate has been removed from an epitaxial substrate.

DETAILS OF EMBODIMENTS OF THE PRESENT INVENTION

The embodiments of the present invention will now be described in more detail.

First Embodiment

Referring now to FIG. 1, a wide band gap semiconductor device according to a first embodiment is described. A MOSFET 101 as an example of the wide band gap semiconductor device according to the first embodiment is a trench gate type transistor. MOSFET 101 has an epitaxial substrate 20 (semiconductor substrate), a gate oxide film 31 (gate insulating film), a gate electrode 32, a drain electrode layer 40 (first electrode layer), a source electrode layer 50 (second electrode layer), and an interlayer insulating film 60.

MOSFET 101 is a power semiconductor device providing switching between drain electrode layer 40 and source electrode layer 50. Specifically, MOSFET 101 is preferably configured to be capable of applying a voltage of 600V or more, more preferably 1200V or more, and still more preferably 3300V or more, between drain electrode layer 40 and source electrode layer 50.

Epitaxial substrate 20 is made of a wide band gap semiconductor. The wide band gap semiconductor is preferably made of silicon carbide, gallium nitride or diamond. In the first embodiment, a wide band gap semiconductor material forming epitaxial substrate 20 is silicon carbide having a hexagonal crystal structure. Epitaxial substrate 20 has an upper surface P2, a lower surface P1, and a substrate side surface PS connecting lower surface P1 and upper surface P2. Epitaxial substrate 20 has a device region 20E, and a peripheral region 20T located on an outer side of device region 20E when viewed two-dimensionally.

In device region 20E, epitaxial substrate 20 includes a single-crystal substrate 29, a drift layer 21 having n type conductivity, a body region 22 having p type conductivity, a source region 23 having n type conductivity, and a contact region 24 having p type conductivity. Single-crystal substrate 29 has one surface forming lower surface P1. Drift layer 21 is provided on the surface of single-crystal substrate 29 that is opposite to lower surface P1. Body region 22 is in contact with drift layer 21. Body region 22 is separated from lower surface P1 by drift layer 21. The impurity concentration in body region 22 is preferably approximately $5 \times 10^{17}$/$cm^3$ or more and approximately $3 \times 10^{18}$/$cm^3$ or less, and is approximately $1 \times 10^{18}$/$cm^3$, for example. Source region 23 is in contact with body region 22. Source region 23 partially forms upper surface P2. Contact region 24 is in contact with body region 22. Contact region 24 partially forms upper surface P2. Contact region 24 is higher in impurity concentration than body region 22.

Source electrode layer 50 is provided on upper surface P2 of epitaxial substrate 20 in the upper portion of device region 20E. Source electrode layer 50 has an ohmic portion 51 and a wiring portion 52. Ohmic portion 51 is in ohmic connection to upper surface P2 of epitaxial substrate 20. Specifically, ohmic portion 51 is in ohmic connection to source region 23 and contact region 24.

In device region 20E, trench TR is provided in upper surface P2 of epitaxial substrate 20. Trench TR has a sidewall surface SW and a bottom surface BT. Sidewall surface SW penetrates through source region 23 and body region 22 to drift layer 21. Thereby, body region 22 forms a portion corresponding to sidewall surface SW in upper surface P2. Sidewall surface SW includes a channel surface of MOSFET 101 on body region 22. Sidewall surface SW of trench TR may include a prescribed surface having a plane orientation of {0-33-8}, and preferably having a plane orientation of (0-33-8).

Gate oxide film 31 covers sidewall surface SW and bottom surface BT of trench TR. That is, gate oxide film 31 covers body region 22 on sidewall surface SW. Gate electrode 32 is provided on gate oxide film 31.

In peripheral region 20T, epitaxial substrate 20 includes single-crystal substrate 29, drift layer 21 having n type conductivity, an electric field relaxing region 25, and a field stop region 28. Electric field relaxing region 25 has a JTE (Junction Termination Extension) region 26 and a guard ring region 27. Epitaxial substrate 20 has a plurality of stepped portions 71 in peripheral region 20T. The plurality of stepped portions 71 each have a step surface 71c inclined with respect to upper surface P2, and a bottom surface 70a intersecting with step surface 71c. Step surface 71c of stepped portion 71 and sidewall surface SW of trench TR may be provided parallel to each other. Stepped portions 71 are formed to annularly surround the outer periphery of device region 20E, and preferably extend in a direction along the outer periphery of device region 20E. Electric field relaxing region 25 and field stop region 28 include upper surface P2, and are formed along the plurality of stepped portions 71. While the plurality of stepped portions 71 are formed in a step-like manner in this embodiment, this is not limiting. If one or more stepped portions 71 are formed, the creepage distance of upper surface P2 can be increased in peripheral region 20T.

JTE region 26 has p type conductivity and is connected to body region 22. The impurity concentration in JTE region 26 is approximately $1\times10^{16}$ cm$^{-3}$ or more and $1\times10^{19}$ cm$^{-3}$ or less, and preferably approximately $1\times10^{17}$ cm$^{-3}$ or more and $1\times10^{18}$ cm$^{-3}$ or less. JTE region 26 may at least partially be covered with gate oxide film 31. In this case, JTE region 26 is formed to be located on an outer side of body region 22 in device region 20E, and includes upper surface P2.

Guard ring region 27 has p type conductivity and is connected to JTE region 26. That is, guard ring region 27 is connected to body region 22 with JTE region 26 interposed therebetween. As described above, guard ring region 27 is formed along the plurality of stepped portions 71 formed in drift layer 21, and to include upper surface P2. That is, guard ring region 27 is formed in peripheral region 20T to include upper surface P2 from a position which is connected to JTE region 26 and includes upper surface P2 to a position which is in contact with field stop region 28 and farthest from a surface of dielectric layer 61 (position closest to lower surface P1). In this embodiment, the impurity concentration in guard ring region 27 is equal to the impurity concentration in JTE region 26, and is approximately $1\times10^{16}$ cm$^{-3}$ or more and $1\times10^{19}$ cm$^{-3}$ or less, and preferably approximately $1\times10^{17}$ cm$^{-3}$ or more and $1\times10^{18}$ cm$^{-3}$ or less.

A thickness T1 of guard ring region 27 formed on terrace surface 71a of stepped portion 71 is set to be greater than a thickness T2 of guard ring region 27 formed on step surface 71c of stepped portion 71.

Step surface 71c of stepped portion 71 may be an inclined surface having any angle with respect to upper surface P2, or may be formed perpendicular to upper surface P2. Preferably, step surface 71c is a surface that self-forms by thermal etching or the like. In this case, stepped portion 71 can be formed with the same method as that of trench TR, as will be described later, thereby suppressing the occurrence of a damaged layer in step surface 71c due to processing.

Field stop region 28 has n type conductivity and is higher in impurity concentration than drift layer 21. Field stop region 28 is formed on upper surface P2 of epitaxial substrate 20, close to the outer periphery of MOSFET 101 so as to surround guard ring region 27. That is, field stop region 28 is formed in peripheral region 20T in a position farthest from the surface of dielectric layer 61, so as to include upper surface P2.

Drain electrode layer 40 is provided on lower surface P1 of epitaxial substrate 20. Drain electrode layer 40 is in ohmic connection to lower surface P1 of epitaxial substrate 20.

Interlayer insulating film 60 is provided on upper surface P2 of epitaxial substrate 20 and covers gate electrode 32. Gate oxide film 31 and interlayer insulating film 60 each have an opening through which each of source region 23 and contact region 24 is exposed at upper surface P2. In this opening, ohmic portion 51 of source electrode layer 50 is in ohmic contact with each of source region 23 and contact region 24.

Dielectric layer 61 is formed on upper surface P2 to fill stepped portion 71 in peripheral region 20T. That is, peripheral region 20T is planarized by dielectric layer 61. Stated from a different viewpoint, dielectric layer 61 is formed such that its thickness is greater on the side close to the outer periphery than on the side close to device region 20E in peripheral region 20T. Dielectric layer 61 may be formed as one piece with, or as a separate piece from interlayer insulating film 60. A material forming dielectric layer 61 may include at least one selected from the group consisting of, for example, silicon dioxide ($SiO_2$), polyimide, silicon nitride (SiN), and hafnium oxide ($HfO_2$). In this embodiment, dielectric layer 61 is formed as one piece with interlayer insulating film 60, and made of silicon dioxide.

Referring now to FIGS. 1 to 7, a method of manufacturing the wide band gap semiconductor device according to the first embodiment is described.

First, single-crystal substrate 29 having lower surface P1 is prepared. Then, drift layer 21 is formed by epitaxial growth on the surface opposite to lower surface P1. This epitaxial growth may be carried out with the CVD (Chemical Vapor Deposition) method. In this case, hydrogen gas may be used as carrier gas. Examples of source material gas may be mixed gas of silane ($SiH_4$) and propane ($C_3H_8$). In this case, it is preferred that nitrogen (N) or phosphorus (P) be introduced as impurities, for example.

Then, body region 22, source region 23, contact region 24, and electric field relaxing region 25 are formed on drift layer 21, which may be implemented by ion implantation. Then, an activation annealing process for activating the impurities introduced by ion implantation is carried out. For example, heating is carried out for 30 minutes at a temperature of about 1700° C. in an atmosphere of argon (Ar) gas.

Then, a mask layer 90 having an opening is formed with the photolithography method, for example, on electric field relaxing region 25. Mask layer 90 can be made, for example, using silicon dioxide or a silicon oxide film.

Figure 2:
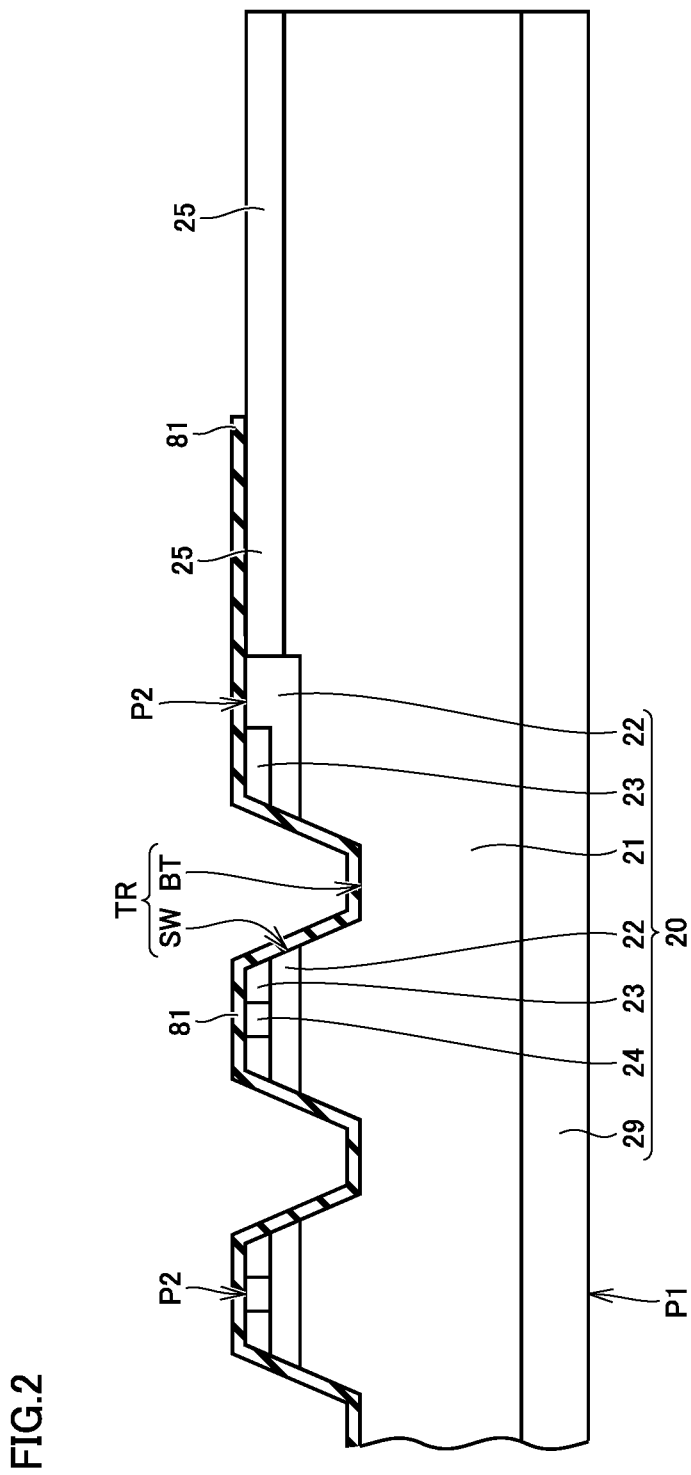
FIG. 2 is a cross-sectional view illustrating a method of manufacturing the wide band gap semiconductor device according to the first embodiment.
Figure 3:
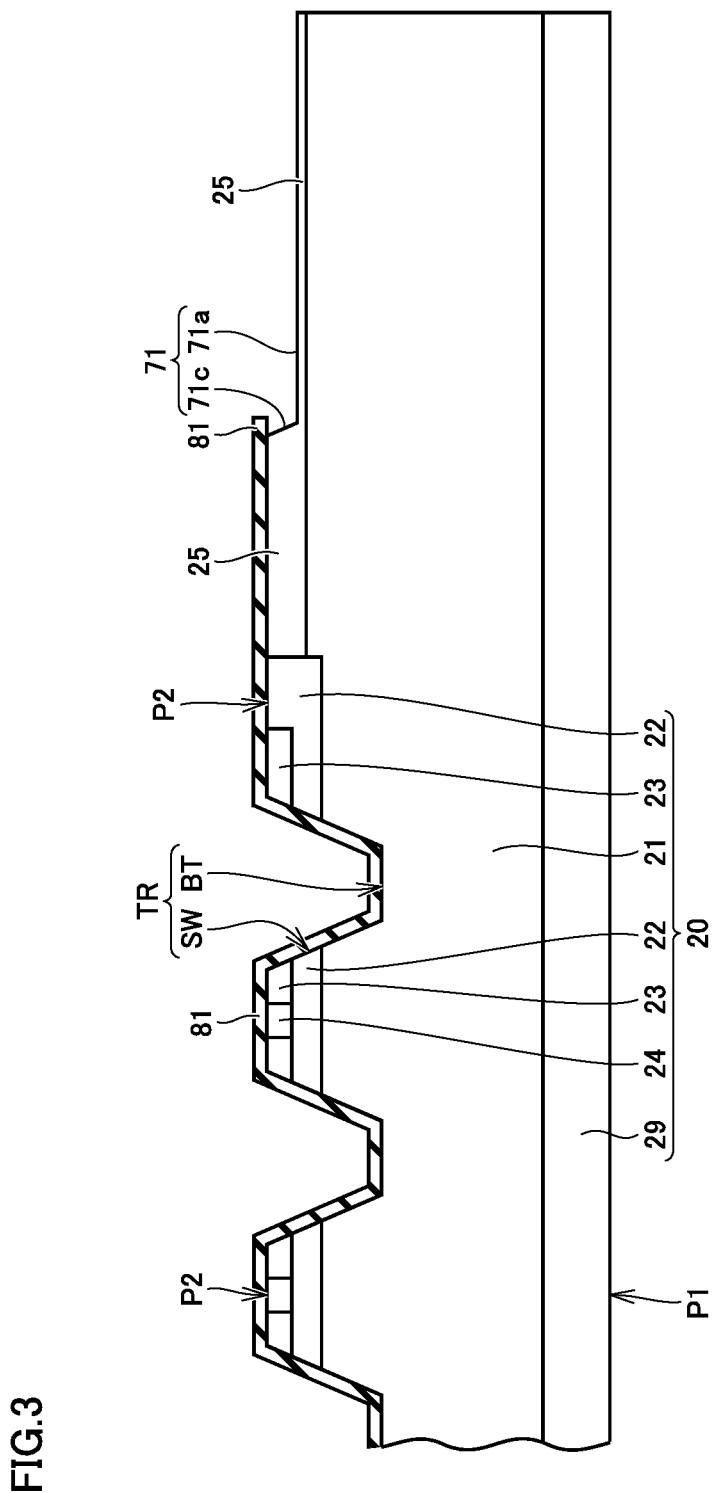
FIG. 3 is a cross-sectional view illustrating the method of manufacturing the wide band gap semiconductor device according to the first embodiment.
Figure 4:
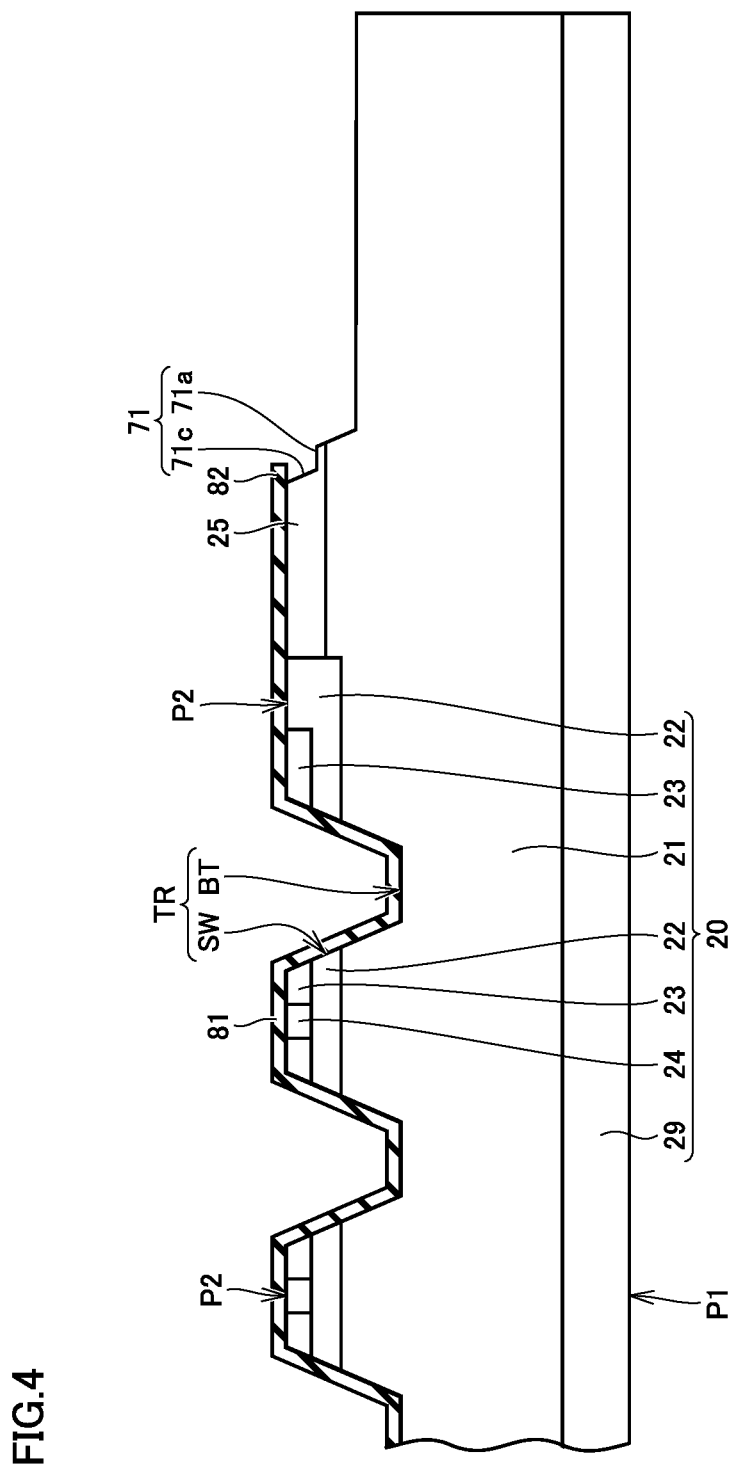
FIG. 4 is a cross-sectional view illustrating the method of manufacturing the wide band gap semiconductor device according to the first embodiment.

Then, trench TR is formed in epitaxial substrate 20 by etching using mask layer 90, in which case thermal etching is preferred. Thermal etching may be carried out by heating in an atmosphere containing reaction gas having at least one or more types of halogen atoms, for example. The at least one or more types of halogen atoms each contain at least one of a chlorine (Cl) atom and a fluorine (F) atom. This atmosphere is $Cl_2$, $BCl_3$, $SF_6$, or $CF_4$, for example. Thermal etching is carried out using mixed gas of chlorine gas and oxygen gas as reaction gas, for example, at a heat treatment temperature of about 700° C. or higher and about 1000° C. or lower, for example. It is noted that the reaction gas may contain carrier gas in addition to the chlorine gas and oxygen gas described above. Examples of the carrier gas can be nitrogen ($N_2$) gas, argon gas, helium gas, and the like. Consequently, trench TR having sidewall surface SW inclined with respect to upper surface P2 is formed in epitaxial substrate 20. Sidewall surface SW of trench TR thus formed includes a prescribed surface having a plane orientation of {0-33-8}. After the formation of trench TR, mask layer 90 is removed with any method such as etching. The structure shown in FIG. 2 is thus obtained.

Then, the plurality of stepped portions 71 are formed. Specifically, first, a mask layer 81 having an opening is formed with the photolithography method, for example, on electric field relaxing region 25. Mask layer 81 can be made, for example, using silicon dioxide or a silicon oxide film.

Then, one stepped portion 71 is formed in epitaxial substrate 20 by etching using mask layer 81, in which case thermal etching is preferred. Thermal etching may be carried out by heating in an atmosphere containing reaction gas having at least one or more types of halogen atoms, for example. The at least one or more types of halogen atoms each contain at least one of a chlorine (Cl) atom and a fluorine (F) atom. This atmosphere is $Cl_2$, $BCl_3$, $SF_6$, or $CF_4$, for example. Thermal etching is carried out using mixed gas of chlorine gas and oxygen gas as reaction gas, for example, at a heat treatment temperature of about 700° C. or higher and about 1000° C. or lower, for example. It is noted that the reaction gas may contain carrier gas in addition to the chlorine gas and oxygen gas described above. Examples of the carrier gas can be nitrogen ($N_2$) gas, argon gas, helium gas, and the like. Consequently, referring to FIG. 3, one stepped portion 71 having step surface 71c inclined with respect to upper surface P2 is formed in electric field relaxing region 25. In this case, step surface 71c of stepped portion 71 includes a prescribed surface having a plane orientation of {0-33-8}.

Then, a mask layer 82 having an opening is formed on electric field relaxing region 25. Mask layer 82 is formed by processing mask layer 81, or newly formed with the photolithography method. In this case, it is preferred that mask layer 82 be formed to have an opening larger than the opening of mask layer 81 on the side close to device region 20E. In this manner, referring to FIG. 4, two stepped portions 71 are formed in peripheral region 20T. A prescribed number of stepped portions 71 can be formed by repeating the same steps.

Figure 5:
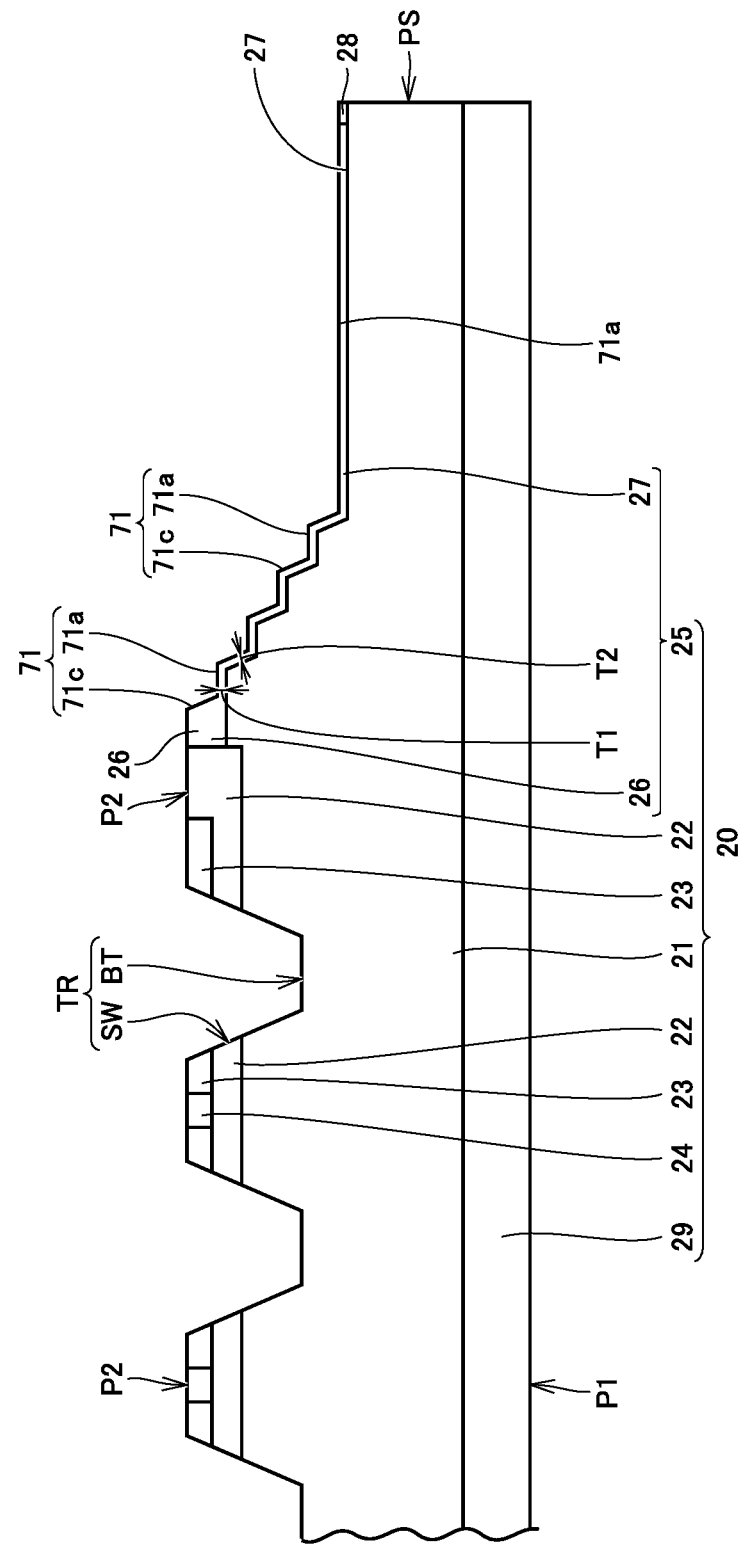
FIG. 5 is a cross-sectional view illustrating the method of manufacturing the wide band gap semiconductor device according to the first embodiment.

Then, referring to FIG. 5, guard ring region 27 and the field stop portion are formed on the plurality of stepped portions 71 formed in peripheral region 20T, which may be implemented by ion implantation after device region 20E is covered with an ion implantation mask (not shown). Then, an activation annealing process for activating the impurities introduced by ion implantation is carried out. For example, heating is carried out for 30 minutes at a temperature of about 1700° C. in an atmosphere of argon (Ar) gas. The structure shown in FIG. 5 is thus obtained.

Figure 6:
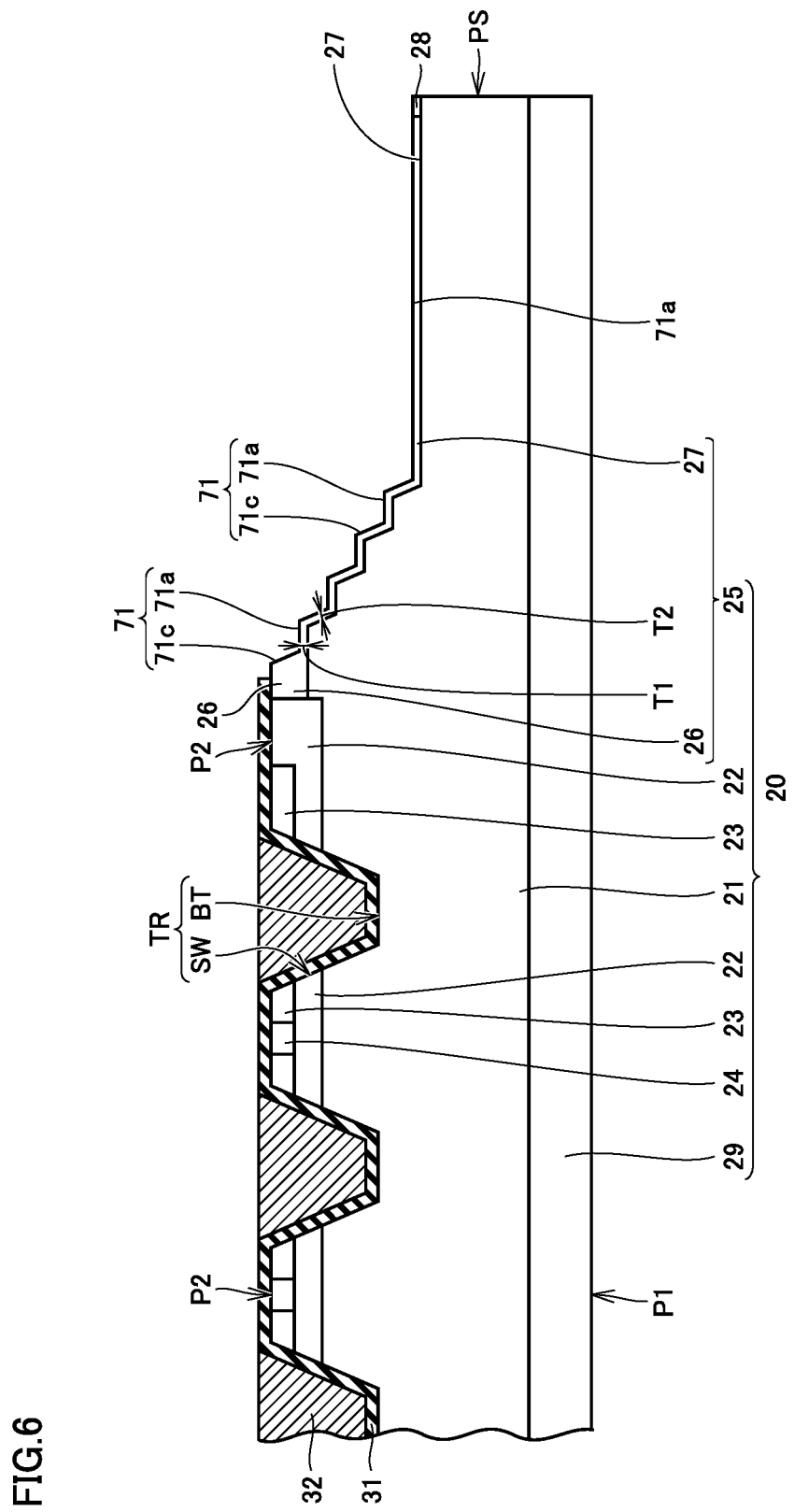
FIG. 6 is a cross-sectional view illustrating the method of manufacturing the wide band gap semiconductor device according to the first embodiment.

Then, referring to FIG. 6, gate oxide film 31 covering each of sidewall surface SW and bottom surface BT of trench TR is formed. Gate oxide film 31 may be formed by thermal oxidation of epitaxial substrate 20, for example. Gate oxide film 31 may be formed to a portion over at least a portion of JTE region 26, or may be formed to cover each of a sidewall surface and a bottom surface of a peripheral region trench 70, for example, in peripheral region 20T.

Then, gate electrode 32 is formed on gate oxide film 31. Specifically, gate electrode 32 is formed to fill a region inside trench TR (region enclosed by sidewall surface SW and bottom surface BT) with gate oxide film 31 interposed therebetween. First, a conductor film to become gate electrode 32 is formed with the sputtering method or the like on gate oxide film 31. Examples of a material for the conductor film can be any material such as metal as long as it is a conductive material. Subsequently, a portion of the conductor film formed in a region other than the inside of trench TR is removed with any method such as etching back or the CMP method. The structure shown in FIG. 6 is thus obtained.

Figure 7:
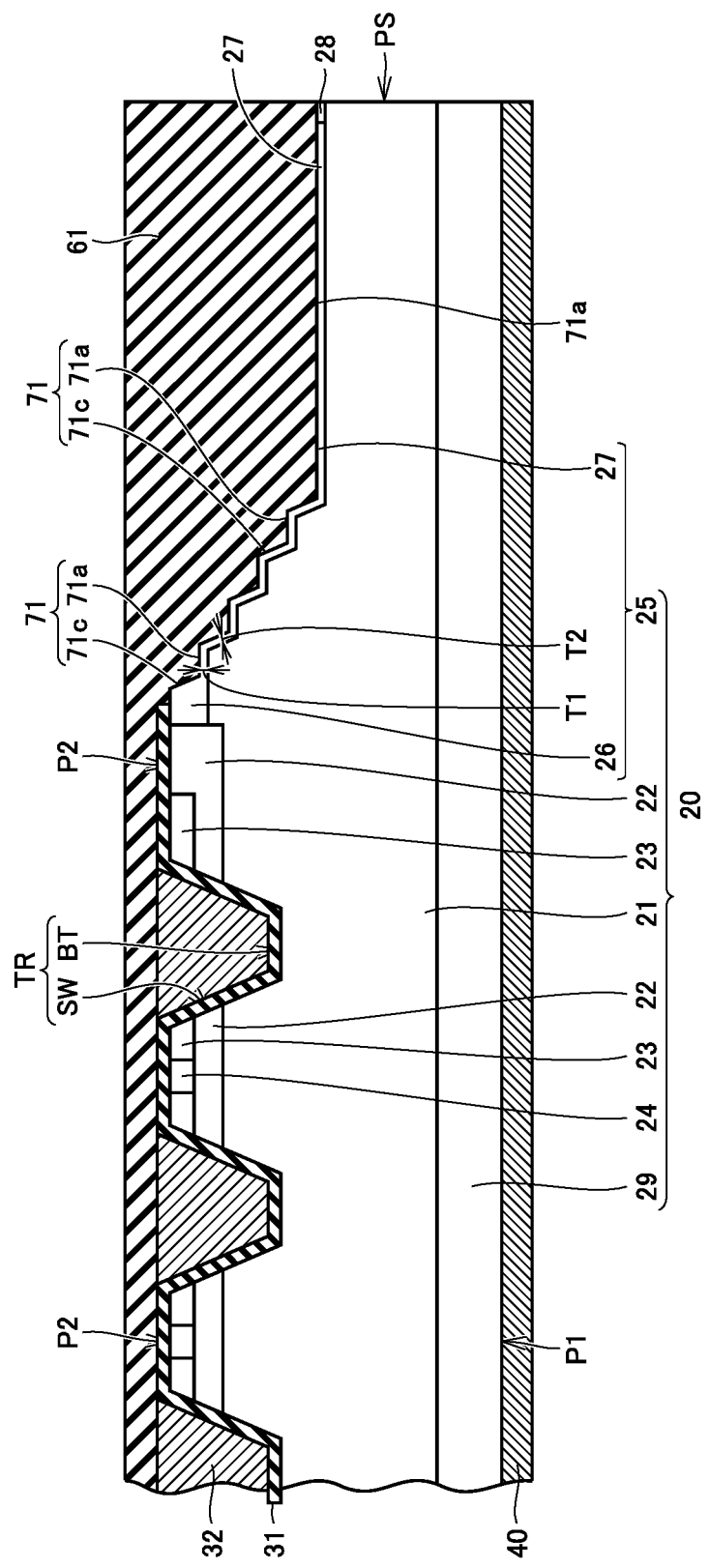
FIG. 7 is a cross-sectional view illustrating the method of manufacturing the wide band gap semiconductor device according to the first embodiment.

Then, referring to FIG. 7, interlayer insulating film 60 is formed on gate oxide film 31 and gate electrode 32, and dielectric layer 61 is formed on JTE region 26, guard ring region 27, and field stop region 28. Interlayer insulating film 60 and dielectric layer 61 may be formed as one piece or as separate pieces.

Then, source electrode layer 50 is formed. Specifically, first, etching is carried out such that an opening is formed in each of gate oxide film 31 and interlayer insulating film 60. This opening exposes each of source region 23 and contact region 24 at upper surface P2. Then, ohmic portion 51 in contact with each of source region 23 and n contact region 24 on upper surface P2 is formed. Then, wiring portion 52 is formed. MOSFET 101 shown in FIG. 1 is thus obtained.

Although stepped portion 71 is formed after the formation of trench TR in the method of manufacturing MOSFET 101 according to the first embodiment described above, stepped portion 71 may be formed before the formation of trench TR.

A function and effect of MOSFET 101 according to the first embodiment will now be described. In MOSFET 101 according to the first embodiment, since the plurality of stepped portions 71 annularly surrounding device region 20E are formed in peripheral region 20T, a creepage distance of upper surface P2 can be increased in a direction from device region 20E toward the outer peripheral end of the wide band gap semiconductor device. That is, the creepage distance of main surface P2 in peripheral region 20T can be increased without an increase in spatial distance of peripheral region 20T (the shortest straight-line distance from device region 20E to the outer peripheral end of the wide band gap semiconductor device). As a result, MOSFET 101 according to the first embodiment can achieve a higher breakdown voltage without an increase in size.

Further, in MOSFET 101 according to the first embodiment, thickness T1 of electric field relaxing region 25 on terrace surface 71a is greater than thickness T2 of electric field relaxing region 25 on step surface 71c. Accordingly, at an interface between drift layer 21 and electric field relaxing region 25, a depletion layer can be readily expanded in a direction perpendicular to upper surface P2. Thus, depletion layers formed at the interface between drift layer 21 and electric field relaxing region 25 formed along the plurality of stepped portions 71 on drift layer 21 can be connected together in a direction parallel to upper surface P2 as well, allowing for the formation of a large depletion layer in peripheral region 20T in both directions parallel to and perpendicular to upper surface P2. As a result, MOSFET 101 according to the first embodiment can achieve a further improved breakdown voltage.

Further, dielectric layer 61 is formed on stepped portions 71, and electric field relaxing region 25 is formed to be sandwiched between drift layer 21 and dielectric layer 61 in stepped portions 71. Accordingly, dielectric layer 61 can protect electric field relaxing region 25, and more effectively relax electric field concentration in semiconductor substrate 20 and at an interface (upper surface P2) between semiconductor substrate 20 and dielectric layer 61 in peripheral region 20T.

Further, in MOSFET 101 according to the first embodiment, the plurality of stepped portions 71 are formed in a step-like manner toward lower surface P1 as the distance to the outer periphery decreases. That is, an end portion of electric field relaxing region 25 that is located close to the outer periphery of the wide band gap semiconductor device (portion in contact with field stop region 28) is formed in a position closer to lower surface P1 than any other portion of electric field relaxing region 25. In this case, since dielectric layer 61 is formed to fill stepped portions 71, dielectric layer 61 is formed such that its thickness increases from a portion over the end portion of electric field relaxing region 25 that is located close to device region 20E (JTE region 26) toward a portion over the outermost peripheral end of electric field relaxing region 25. Thus, MOSFET 101 according to the first embodiment can relax electric field concentration close to the outer periphery of peripheral region 20 where electric field concentration tends to occur upon application of a high voltage in a common semiconductor device having a guard ring structure, and can lower the potential of the surface of dielectric layer 61 located close to the outer periphery of peripheral region 20T. As a result, MOSFET 101 according to the first embodiment can lower the risk of occurrence of discharge on dielectric layer 61.

First Reference Example

Figure 8:
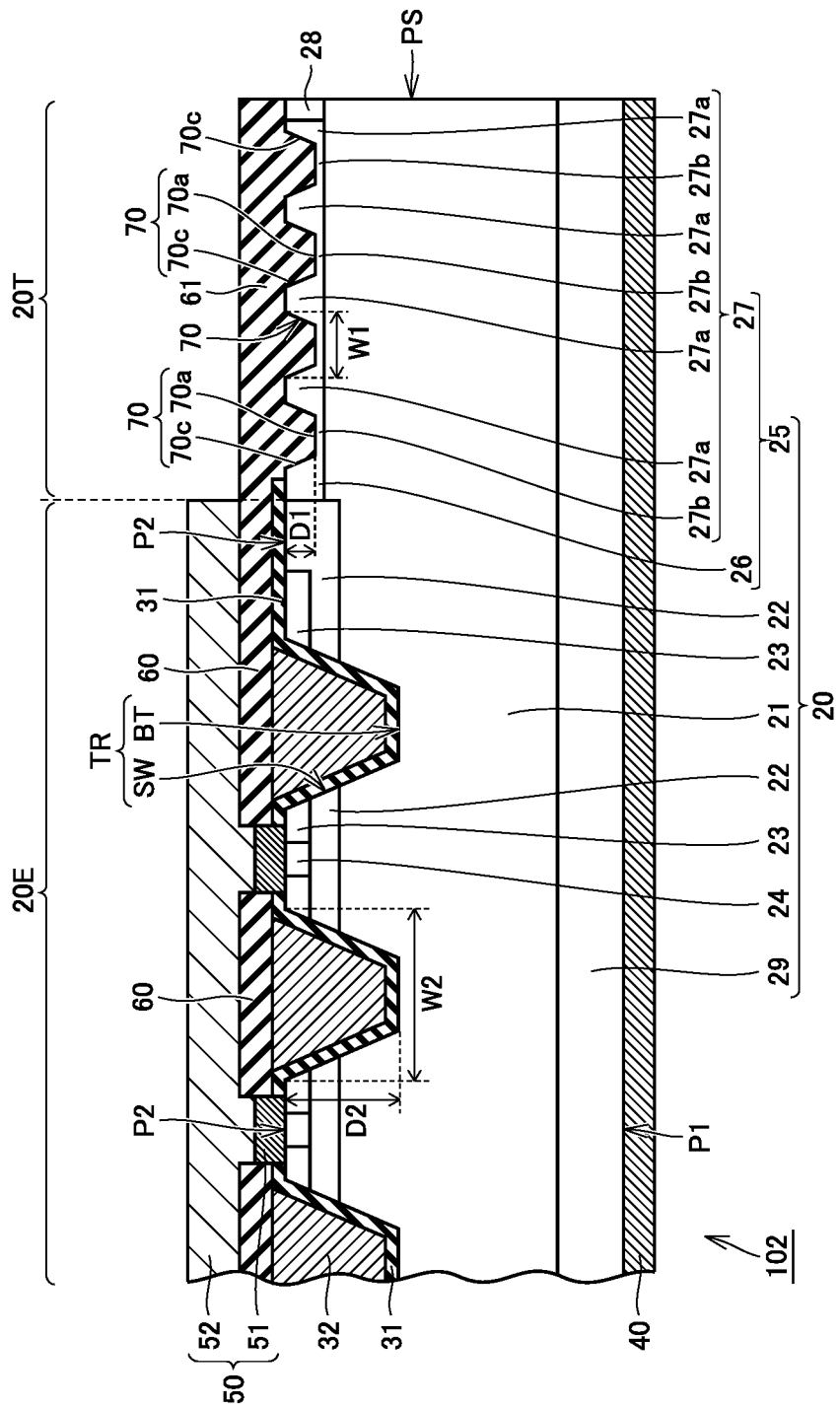
FIG. 8 is a cross-sectional view of a wide band gap semiconductor device according to a first reference example.

Referring to FIG. 8, a wide band gap semiconductor device according to a first reference example is described. A MOSFET 102 as an example of the wide band gap semiconductor device according to the first reference example is a trench gate type transistor. MOSFET 102 includes epitaxial substrate 20 (semiconductor substrate), gate oxide film 31 (gate insulating film), gate electrode 32, drain electrode layer 40 (first electrode layer), source electrode layer 50 (second electrode layer), and interlayer insulating film 60.

MOSFET 102 is a power semiconductor device providing switching between drain electrode layer 40 and source electrode layer 50. Specifically, MOSFET 102 is preferably configured to be capable of applying a voltage of 600V or more, more preferably 1200V or more, and still more preferably 3300V or more, between drain electrode layer 40 and source electrode layer 50.

Epitaxial substrate 20 is made of a wide band gap semiconductor. The wide band gap semiconductor is preferably made of silicon carbide, gallium nitride or diamond. In the first embodiment, a wide band gap semiconductor material forming epitaxial substrate 20 is silicon carbide having a hexagonal crystal structure. Epitaxial substrate 20 has upper surface P2, lower surface 20B, and substrate side surface PS connecting lower surface 20B and upper surface P2. Epitaxial substrate 20 has device region 20E, and peripheral region 20T located on an outer side of device region 20E when viewed two-dimensionally.

In device region 20E, epitaxial substrate 20 includes single-crystal substrate 29, drift layer 21 having n type conductivity, body region 22 having p type conductivity, source region 23 having n type conductivity, and contact region 24 having p type conductivity. Single-crystal substrate 29 has one surface forming lower surface 20B. Drift layer 21 is provided on the surface of single-crystal substrate 29 that is opposite to lower surface 20B. Body region 22 is in contact with drift layer 21. Body region 22 is separated from lower surface 20B by drift layer 21. The impurity concentration in body region 22 is preferably approximately $5 \times 10^{17}/cm^{-3}$ or more and approximately $3 \times 10^{18}/cm^{-3}$ or less, and is approximately $1 \times 10^{18}/cm^{-3}$, for example. Source region 23 is in contact with body region 22. Source region 23 partially forms upper surface P2. Contact region 24 is in contact with body region 22. Contact region 24 partially forms upper surface P2. Contact region 24 is higher in impurity concentration than body region 22.

Source electrode layer 50 is provided on upper surface P2 of epitaxial substrate 20 in the upper portion of device region 20E. Source electrode layer 50 has ohmic portion 51 and wiring portion 52. Ohmic portion 51 is in ohmic connection to upper surface P2 of epitaxial substrate 20. Specifically, ohmic portion 51 is in ohmic connection to source region 23 and contact region 24.

In device region 20E, trench TR is provided in upper surface P2 of epitaxial substrate 20. Trench TR has sidewall surface SW and bottom surface BT. Sidewall surface SW penetrates through source region 23 and body region 22 to drift layer 21. Thereby, body region 22 forms a portion corresponding to sidewall surface SW in upper surface P2. Sidewall surface SW includes a channel surface of MOSFET 102 on body region 22. Sidewall surface SW of trench TR may include a prescribed surface having a plane orientation of {0-33-8}, and preferably having a plane orientation of (0-33-8).

Gate oxide film 31 covers sidewall surface SW and bottom surface BT of trench TR. That is, gate oxide film 31 covers body region 22 on sidewall surface SW. Gate electrode 32 is provided on gate oxide film 31.

In peripheral region 20T, epitaxial substrate 20 includes single-crystal substrate 29, drift layer 21 having n type conductivity, electric field relaxing region 25, and field stop region 28. Electric field relaxing region 25 has JTE region 26 and guard ring region 27. A plurality of peripheral region trenches 70 are formed in electric field relaxing region 25. Specifically, the plurality of peripheral region trenches 70 are formed to surround the outer periphery of device region 20E, and preferably extend in a direction along the outer periphery of device region 20E. In a direction perpendicular to a direction in which each peripheral region trench 70 extends, constant spacing may be provided between peripheral region trenches 70.

Peripheral region trenches 70 each have a bottom surface 70a and a sidewall surface 70c in electric field relaxing region 25. Thereby, in electric field relaxing region 25, guard ring region 27 having a thick portion 27a defined by sidewall surface 70c of peripheral region trench 70, and a thin portion 27b defined by bottom surface 70a of peripheral region trench 70 is formed. In this embodiment, the impurity concentration in guard ring region 27 is equal to the impurity concentration in JTE region 26, and is approximately $1 \times 10^{16}$ cm$^{-3}$ or more and 1×10$^{19}$ cm$^{-3}$ or less, and preferably approximately 1×10$^{17}$ cm$^{-3}$ or more and 1×10$^{18}$ cm$^{-3}$ or less.

Sidewall surface 70c of peripheral region trench 70 may be formed perpendicular to upper surface P2, or may be an inclined surface having any angle. If sidewall surface 70c of peripheral region trench 70 is formed perpendicular or substantially perpendicular to upper surface P2, a creepage distance of upper surface P2 in peripheral region 20T can be effectively increased by peripheral region trench 70. If sidewall surface 70c of peripheral region trench 70 is formed such that it is inclined with respect to upper surface P2 to a degree similar to sidewall surface SW of trench TR, on the other hand, peripheral region trench 70 can be formed with the same method as that of trench TR, as will be described later, thereby suppressing the occurrence of a damaged layer in sidewall surface 70c due to processing.

A width of peripheral region trench 70 in a direction perpendicular to a direction in which peripheral region trench 70 extends (W1: FIG. 8) is narrower than a width in a direction perpendicular to a direction in which trench TR extends (W2: FIG. 8). In addition, a depth of peripheral region trench 70 in a direction perpendicular to upper surface P2 (D1: FIG. 8) is shallower than a depth of trench TR in the direction perpendicular to upper surface P2 (D2: FIG. 8). Widths W1 and depths D1 of peripheral region trenches 70 may be the same as or different from one another.

JTE region 26 has p type conductivity and is connected to body region 22. The impurity concentration in JTE region 26 is approximately 1×10$^{16}$ cm$^{-3}$ or more and 1×10$^{19}$ cm$^{-3}$ or less, and preferably approximately 1×10$^{17}$ cm$^{-3}$ or more and 1×10$^{18}$ cm$^{-3}$ or less. JTE region 26 may at least partially be covered with gate oxide film 31. In this case, JTE region 26 is formed to be located on an outer side of body region 22 in device region 20E.

Guard ring region 27 has p type conductivity and is connected to JTE region 26. That is, guard ring region 27 is connected to body region 22 with JTE region 26 interposed therebetween. Guard ring region 27 is formed close to the outer periphery of MOSFET 101 so as to surround JTE region 26.

Field stop region 28 has n type conductivity and is higher in impurity concentration than drift layer 21. Field stop region 28 is disposed on upper surface P2 of epitaxial substrate 20 on an outer side of guard ring region 27. Field stop region 28 is formed close to the outer periphery of MOSFET 101 so as to surround guard ring region 27.

Drain electrode layer 40 is provided on lower surface 20B of epitaxial substrate 20. Drain electrode layer 40 is in ohmic connection to lower surface 20B of epitaxial substrate 20.

Interlayer insulating film 60 is provided on upper surface P2 of epitaxial substrate 20 and covers gate electrode 32. Gate oxide film 31 and interlayer insulating film 60 each have an opening through which each of source region 23 and contact region 24 is exposed at upper surface P2. In this opening, ohmic portion 51 of source electrode layer 50 is in ohmic contact with each of source region 23 and contact region 24.

Dielectric layer 61 is formed on upper surface P2 and covers peripheral region trench 70 in peripheral region 20T. In this case, dielectric layer 61 is formed to planarize peripheral region trench 70. Stated from a different viewpoint, dielectric layer 61 is formed with a small film thickness on thick portion 27a and with a great film thickness on thin portion 27b. Dielectric layer 61 may be formed as one piece with, or as a separate piece from interlayer insulating film 60. A material forming dielectric layer 61 may include at least one selected from the group consisting of, for example, silicon dioxide (SiO$_2$), polyimide, silicon nitride (SiN), and hafnium oxide (HfO$_2$). In this embodiment, dielectric layer 61 is formed as one piece with interlayer insulating film 60, and made of silicon dioxide.

Referring now to FIGS. 9 to 14, a method of manufacturing the wide band gap semiconductor device according to the first reference example is described.

Figure 9:
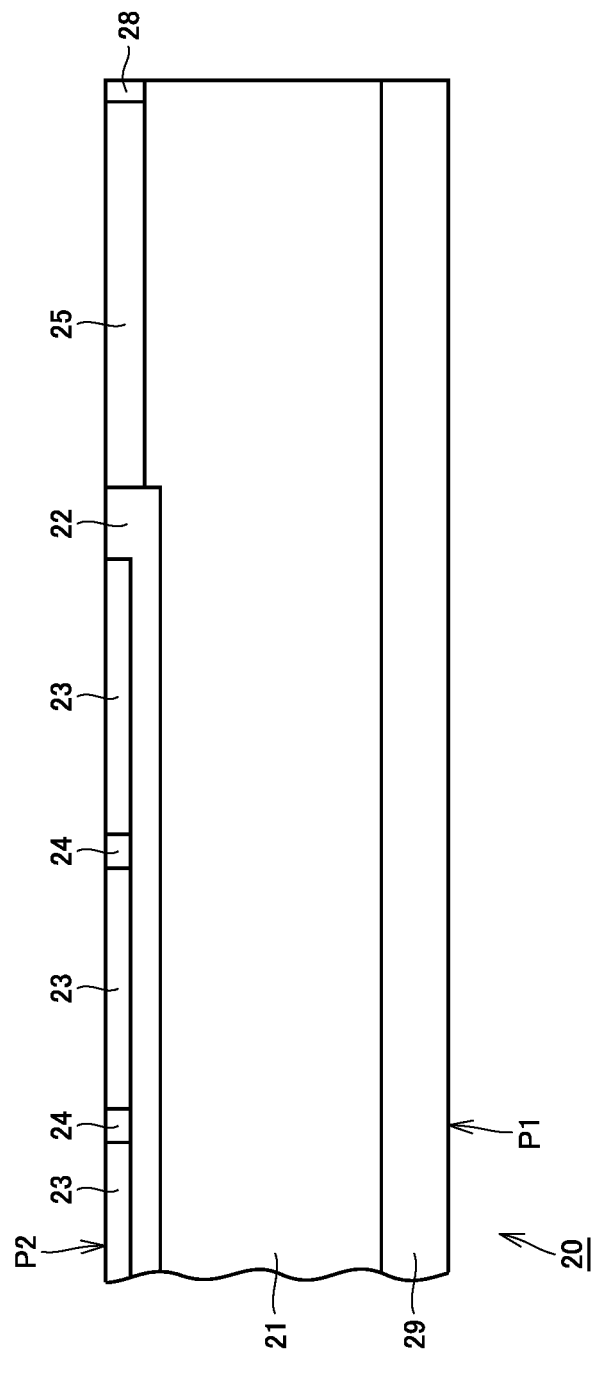
FIG. 9 is a cross-sectional view illustrating a method of manufacturing the wide band gap semiconductor device according to the first reference example.

Referring to FIG. 9, first, single-crystal substrate 29 having lower surface P1 is prepared. Then, drift layer 21 is formed by epitaxial growth on the surface opposite to lower surface P1. This epitaxial growth may be carried out with the CVD method. In this case, hydrogen gas may be used as carrier gas. Examples of source material gas may be mixed gas of silane (SiH$_4$) and propane (C$_3$H$_8$). In this case, it is preferred that nitrogen (N) or phosphorus (P) be introduced as impurities, for example.

Then, body region 22, source region 23, contact region 24, electric field relaxing region 25 and field stop region 28 are formed on drift layer 21, which may be implemented by ion implantation. Then, an activation annealing process for activating the impurities introduced by ion implantation is carried out. For example, heating is carried out for 30 minutes at a temperature of about 1700° C. in an atmosphere of argon (Ar) gas.

Figure 10:
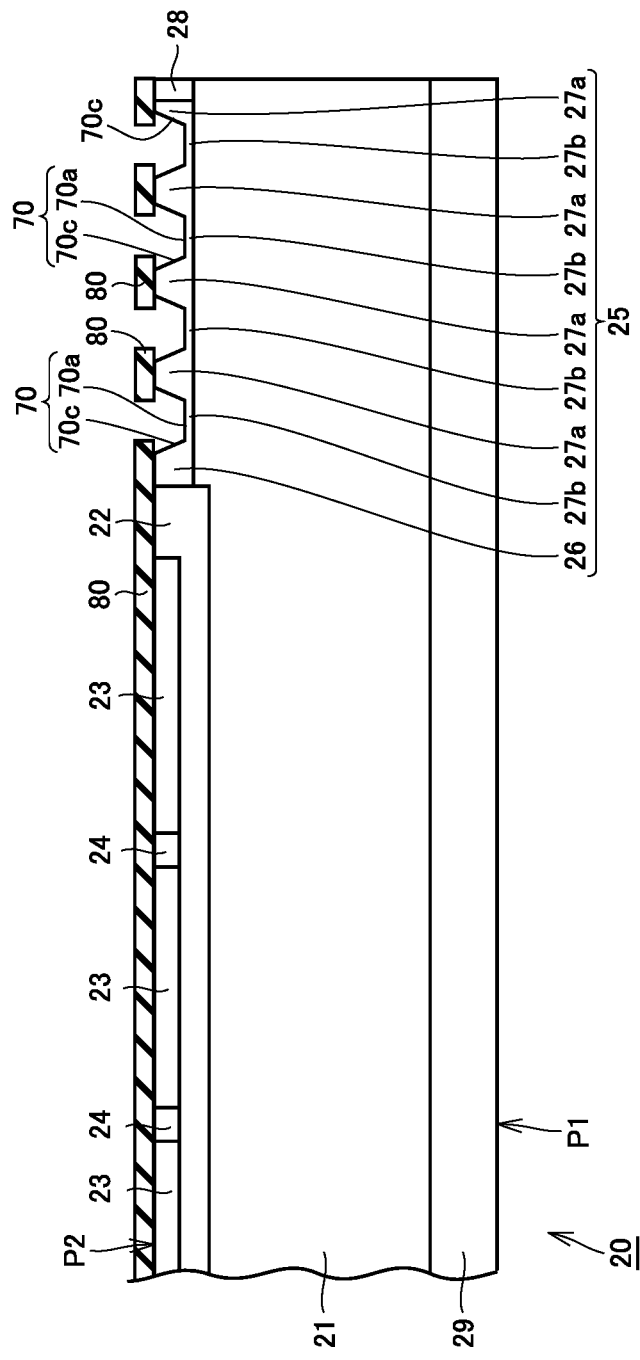
FIG. 10 is a cross-sectional view illustrating the method of manufacturing the wide band gap semiconductor device according to the first reference example.

Then, referring to FIG. 10, a mask layer 80 having an opening is formed with the photolithography method, for example, on electric field relaxing region 25. Mask layer 80 can be made, for example, using silicon dioxide or a silicon oxide film.

Then, peripheral region trench 70 is formed in epitaxial substrate 20 by etching using mask layer 80, in which case thermal etching is preferred. Thermal etching may be carried out by heating in an atmosphere containing reaction gas having at least one or more types of halogen atoms, for example. The at least one or more types of halogen atoms each contain at least one of a chlorine (Cl) atom and a fluorine (F) atom. This atmosphere is Cl$_2$, BCl$_6$, SF$_6$, or CF$_4$, for example. Thermal etching is carried out using mixed gas of chlorine gas and oxygen gas as reaction gas, for example, at a heat treatment temperature of about 700° C. or higher and about 1000° C. or lower, for example. It is noted that the reaction gas may contain carrier gas in addition to the chlorine gas and oxygen gas described above. Examples of the carrier gas can be nitrogen (N$_2$) gas, argon gas, helium gas, and the like. Consequently, peripheral region trench 70 having sidewall surface 70c inclined with respect to upper surface P2 is formed in electric field relaxing region 25. As a result of the formation of peripheral region trench 70, JTE region 26 in contact with body region 22, and thick portion 27a and thin portion 27b connected to JTE region 26 are formed in electric field relaxing region 25. Here, sidewall surface 70c of peripheral region trench 70 includes a prescribed surface having a plane orientation of {0-33-8}. After the formation of peripheral region trench 70, mask layer 80 is removed with any method such as etching.

Figure 11:
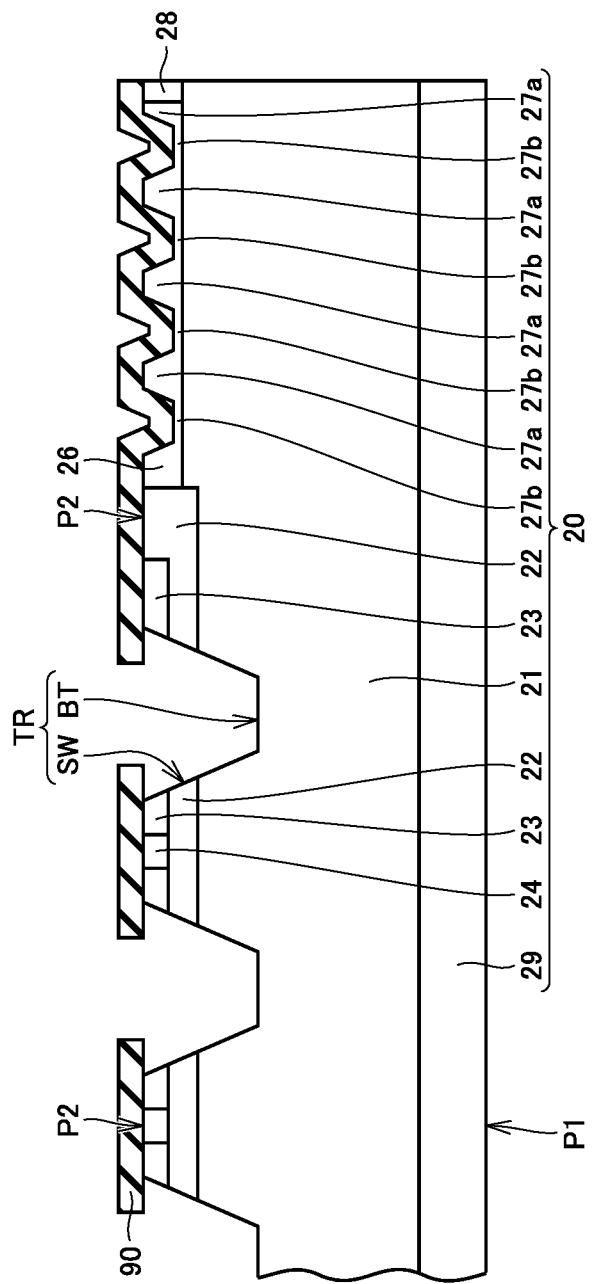
FIG. 11 is a cross-sectional view illustrating the method of manufacturing the wide band gap semiconductor device according to the first reference example.

Then, referring to FIG. 11, mask layer 90 having an opening is formed with the photolithography method, for example, on electric field relaxing region 25. Mask layer 90 can be made, for example, using silicon dioxide or a silicon oxide film.

Then, trench TR is formed in epitaxial substrate 20 by etching using mask layer 90, in which case thermal etching is preferred. Thermal etching may be carried out by heating in an atmosphere containing reaction gas having at least one or more types of halogen atoms, for example. The at least one or more types of halogen atoms each contain at least one of a chlorine (Cl) atom and a fluorine (F) atom. This atmosphere is $Cl_2$, $BCl_3$, $SF_6$, or $CF_4$, for example. Thermal etching is carried out using mixed gas of chlorine gas and oxygen gas as reaction gas, for example, at a heat treatment temperature of about 700° C. or higher and about 1000° C. or lower, for example. It is noted that the reaction gas may contain carrier gas in addition to the chlorine gas and oxygen gas described above. Examples of the carrier gas can be nitrogen ($N_2$) gas, argon gas, helium gas, and the like. Consequently, trench TR having sidewall surface SW inclined with respect to upper surface P2 is formed in epitaxial substrate 20. Sidewall surface SW of trench TR thus formed includes a prescribed surface having a plane orientation of {0-33-8}. After the formation of trench TR, mask layer 90 is removed with any method such as etching.

Figure 12:
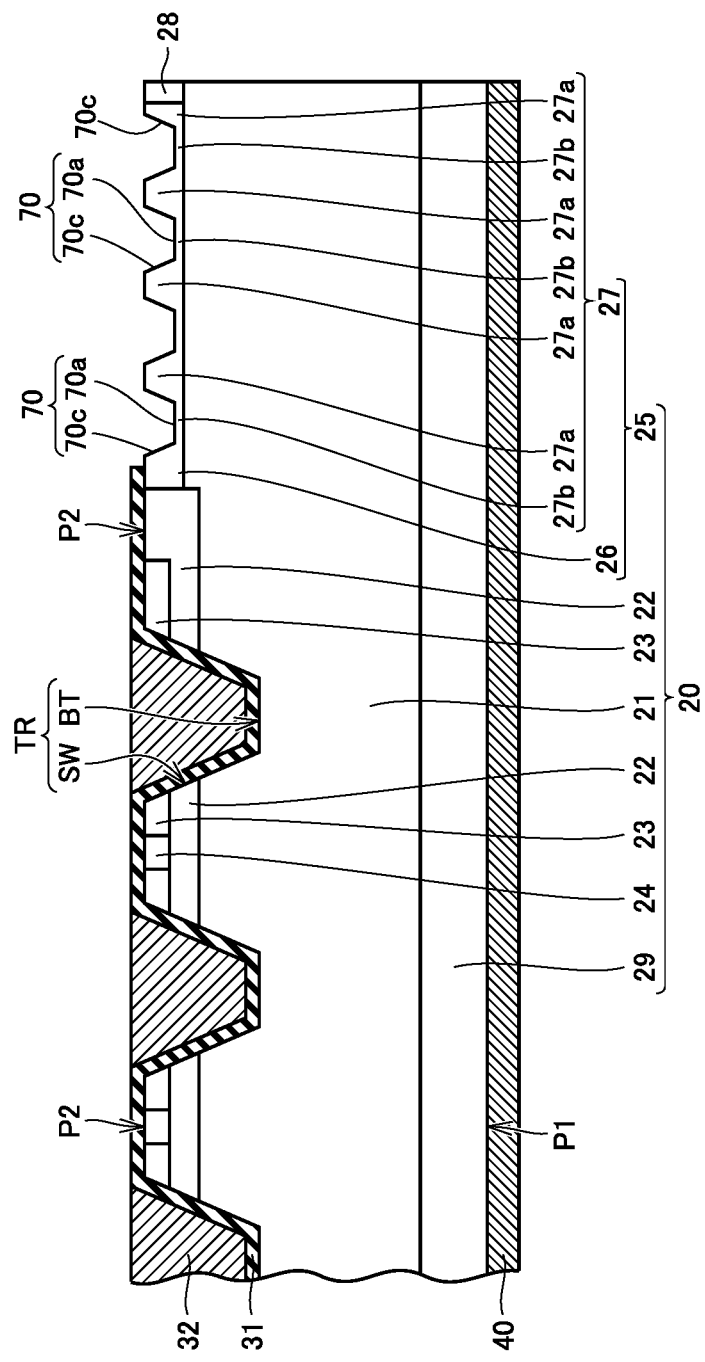
FIG. 12 is a cross-sectional view illustrating the method of manufacturing the wide band gap semiconductor device according to the first reference example.

Then, referring to FIG. 12, gate oxide film 31 covering each of sidewall surface SW and bottom surface BT of trench TR is formed. Gate oxide film 31 may be formed by thermal oxidation of epitaxial substrate 20, for example. Gate oxide film 31 may be formed to a portion over at least a portion of JTE region 26, or may be formed to cover each of the sidewall surface and the bottom surface of peripheral region trench 70, for example, in peripheral region 20T.

Then, gate electrode 32 is formed on gate oxide film 31. Specifically, gate electrode 32 is formed to fill a region inside trench TR (region enclosed by sidewall surface SW and bottom surface BT) with gate oxide film 31 interposed therebetween. First, a conductor film to become gate electrode 32 is formed with the sputtering method or the like on gate oxide film 31. Examples of a material for the conductor film can be any material such as metal as long as it is a conductive material. Subsequently, a portion of the conductor film formed in a region other than the inside of trench TR is removed with any method such as etching back or the CMP method. The structure shown in FIG. 12 is thus obtained.

Figure 13:
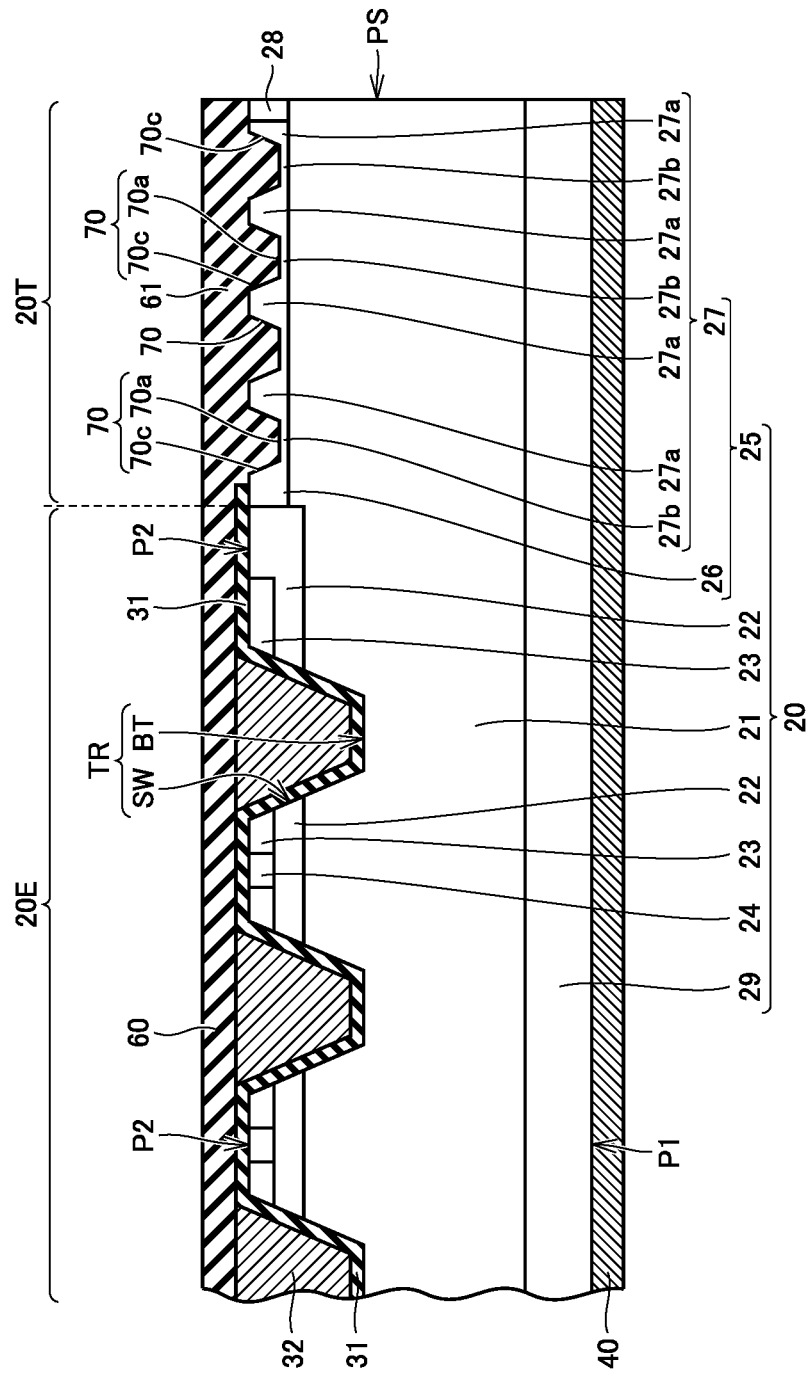
FIG. 13 is a cross-sectional view illustrating the method of manufacturing the wide band gap semiconductor device according to the first reference example.

Then, referring to FIG. 13, interlayer insulating film 60 is formed on gate oxide film 31 and gate electrode 32, and dielectric layer 61 is formed on JTE region 26, guard ring region 27, and field stop region 28. Interlayer insulating film 60 and dielectric layer 61 may be formed as one piece or as separate pieces.

Figure 14:
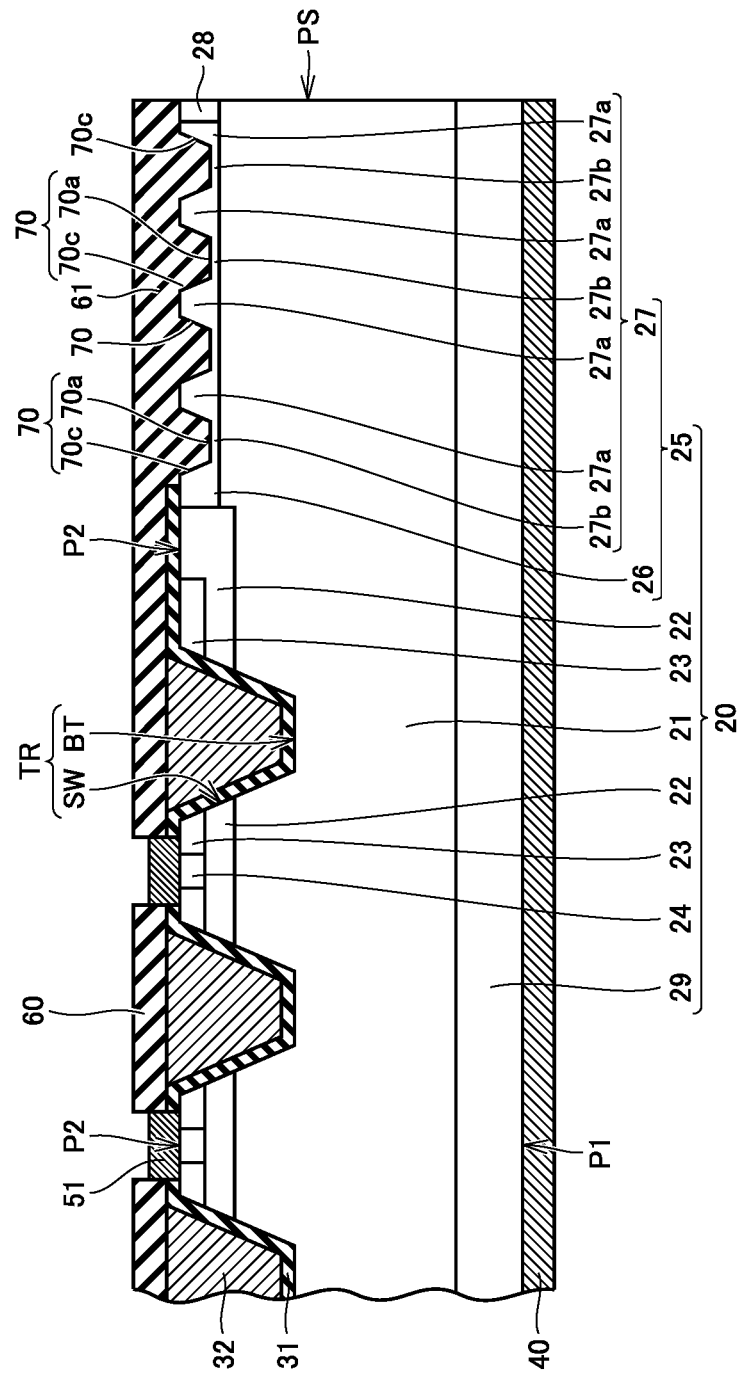
FIG. 14 is a cross-sectional view illustrating the method of manufacturing the wide band gap semiconductor device according to the first reference example.

Then, referring to FIG. 14, source electrode layer 50 is formed. Specifically, first, etching is carried out such that an opening is formed in each of gate oxide film 31 and interlayer insulating film 60. This opening exposes each of source region 23 and contact region 24 at upper surface P2. Then, ohmic portion 51 in contact with each of source region 23 and n contact region 24 on upper surface P2 is formed. Then, wiring portion 52 is formed. MOSFET 102 is thus obtained.

Although peripheral region trench 70 is formed before the formation of trench TR in the method of manufacturing MOSFET 102 according to the first reference example described above, peripheral region trench 70 may be formed after the formation of trench TR.

A function and effect of MOSFET 102 according to the first reference example will now be described. In MOSFET 102 according to the first reference example, since the plurality of peripheral region trenches 70 are formed, the creepage distance of upper surface P2 can be increased in the direction from device region 20E toward the outer peripheral end of the wide band gap semiconductor device. Further, electric field relaxing region 25 is provided without being divided by peripheral region trenches 70. Accordingly, a depletion layer readily expands at an interface between drift layer 21 and electric field relaxing region 25, particularly in a direction parallel to upper surface P2. As a result, electric field concentration in the vicinity of device region 20E and in peripheral region 20T can be effectively relaxed, thereby improving the breakdown voltage of the wide band gap semiconductor device.

Further, since electric field relaxing region 25 is provided without being divided by peripheral region trenches 70, the entire electric field relaxing region 25 can have the same potential. Consequently, the entire electric field relaxing region 25 (JTE region 26 and guard ring region 27) can have the same potential as that of source region 23 by connecting electric field relaxing region 25 to source region 23 on the side close to device region 20E, for example. As a result, when a voltage is applied between the source and drain resulting in depletion of the interface between drift layer 21 and electric field relaxing region 25, and then the application of the voltage is suspended, for example, conductive ions (carriers) in electric field relaxing region 25 can be quickly recovered. Thus, ON operation of the wide band gap semiconductor device can be effected in a state where the conductive ions in electric field relaxing region 25 have been reliably recovered, thereby suppressing characteristic variation during the ON operation.

Second Reference Example

Figure 15:
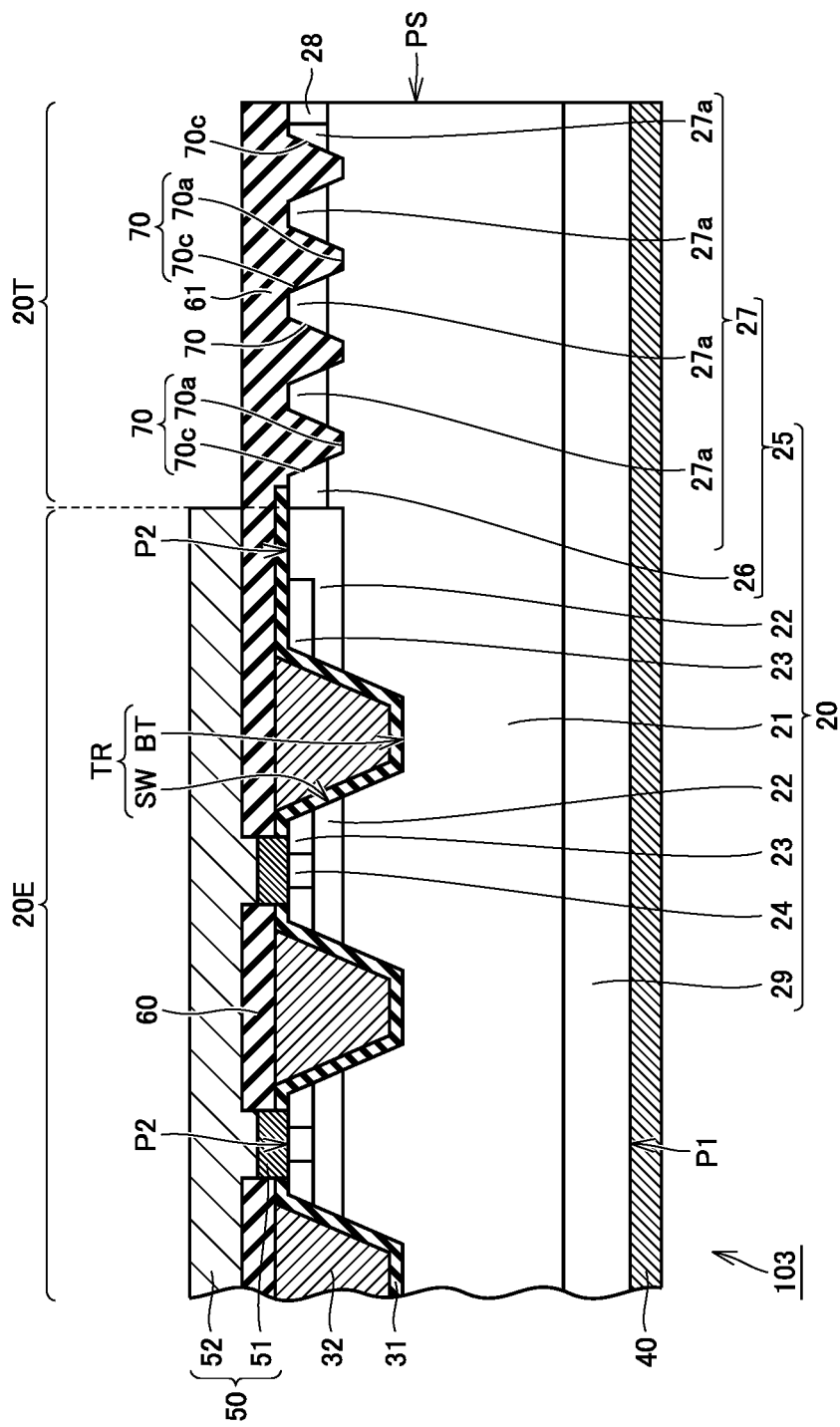
FIG. 15 is a cross-sectional view of a wide band gap semiconductor device according to a second reference example.

Referring now to FIG. 15, a wide band gap semiconductor device according to a second reference example is described. The wide band gap semiconductor device according to the second reference example basically has the same configuration as that of the wide band gap semiconductor device according to the first embodiment, but is different in that sidewall surface 70c of peripheral region trench 70 extends from electric field relaxing region 25 to drift layer 21. In this case, bottom surface 70a of peripheral region trench 70 is formed in drift layer 21. That is, thin portions 27b are not formed in the wide band gap semiconductor device according to the second reference example. In this case, thick portions 27a of guard ring region 27 have a so-called floating guard ring structure in which the plurality of thick portions 27a are formed by being defined by sidewall surfaces 70c of peripheral region trenches 70 but they are not connected together.

Again in this case, since the plurality of peripheral region trenches 70 are formed, the creepage distance of upper surface P2 can be increased in the direction from device region 20E toward the outer peripheral end of the wide band gap semiconductor device, without an increase in spatial distance of peripheral region 20T (the shortest straight-line distance from device region 20E to the outer peripheral end of the wide band gap semiconductor device). As a result, the wide band gap semiconductor device according to the second reference example can achieve a higher breakdown voltage without an increase in size, as with the wide band gap semiconductor device according to the first reference example.

Figure 16:
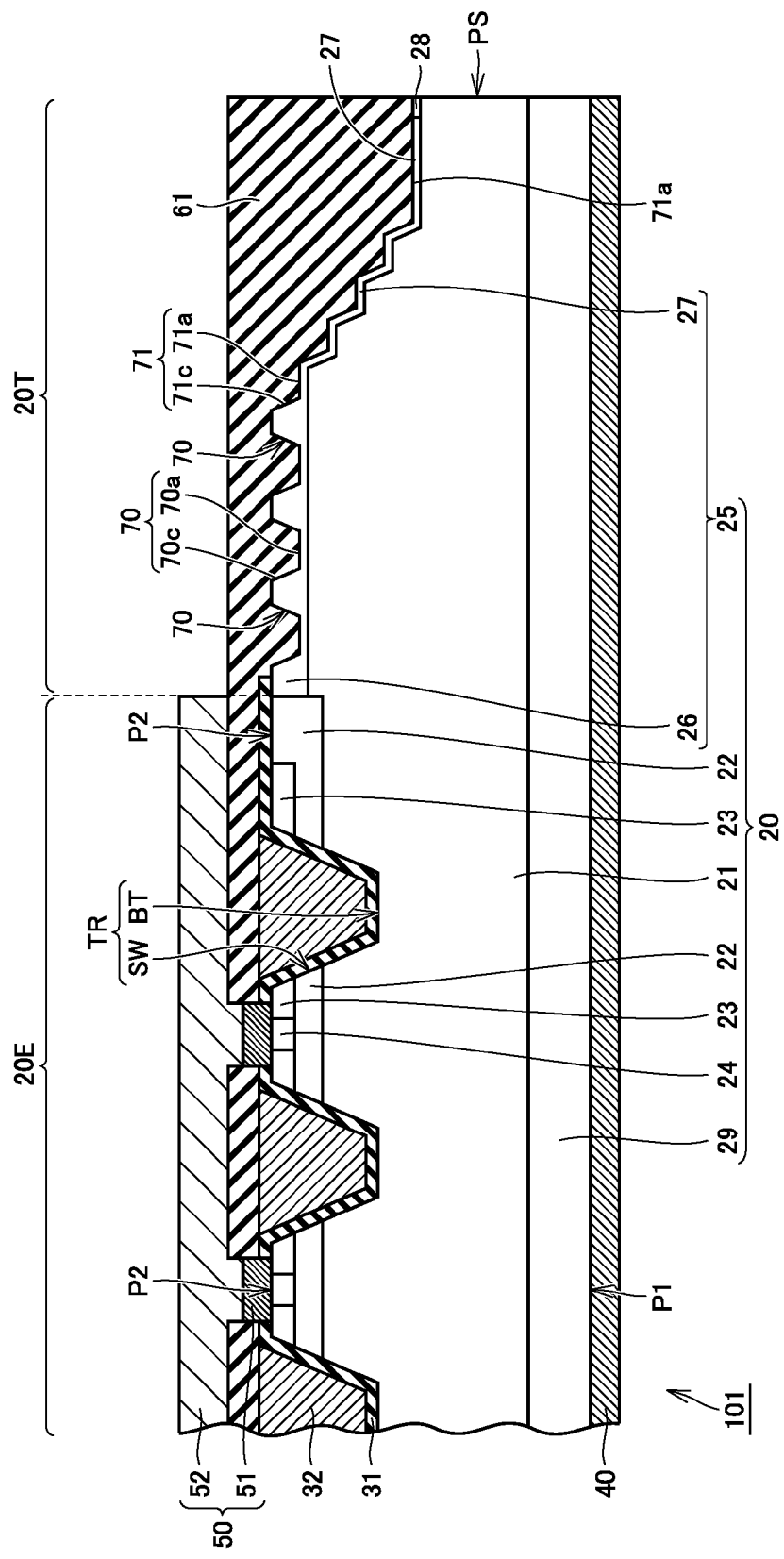
FIG. 16 is a cross-sectional view of a variation of the wide band gap semiconductor device according to the first embodiment.

In addition, referring to FIG. 16, MOSFET 101 according to the first embodiment may further include peripheral region trenches 70 in electric field relaxing region 25. In this case, it is preferred that peripheral region trenches 70 be formed in electric field relaxing region 25 located closer to device region 20E than the plurality of stepped portions 71. Although peripheral region trenches 70 are formed in electric field relaxing region 25 in the example shown in FIG. 16, sidewall surface 70c of each peripheral region trench 70 may extend from electric field relaxing region 25 to drift layer 21, with bottom surface 70a formed in drift layer 21. Consequently, the same effects as those of MOSFETs 102, 103 according to the first and second reference examples described above can be further achieved.

Figure 17:
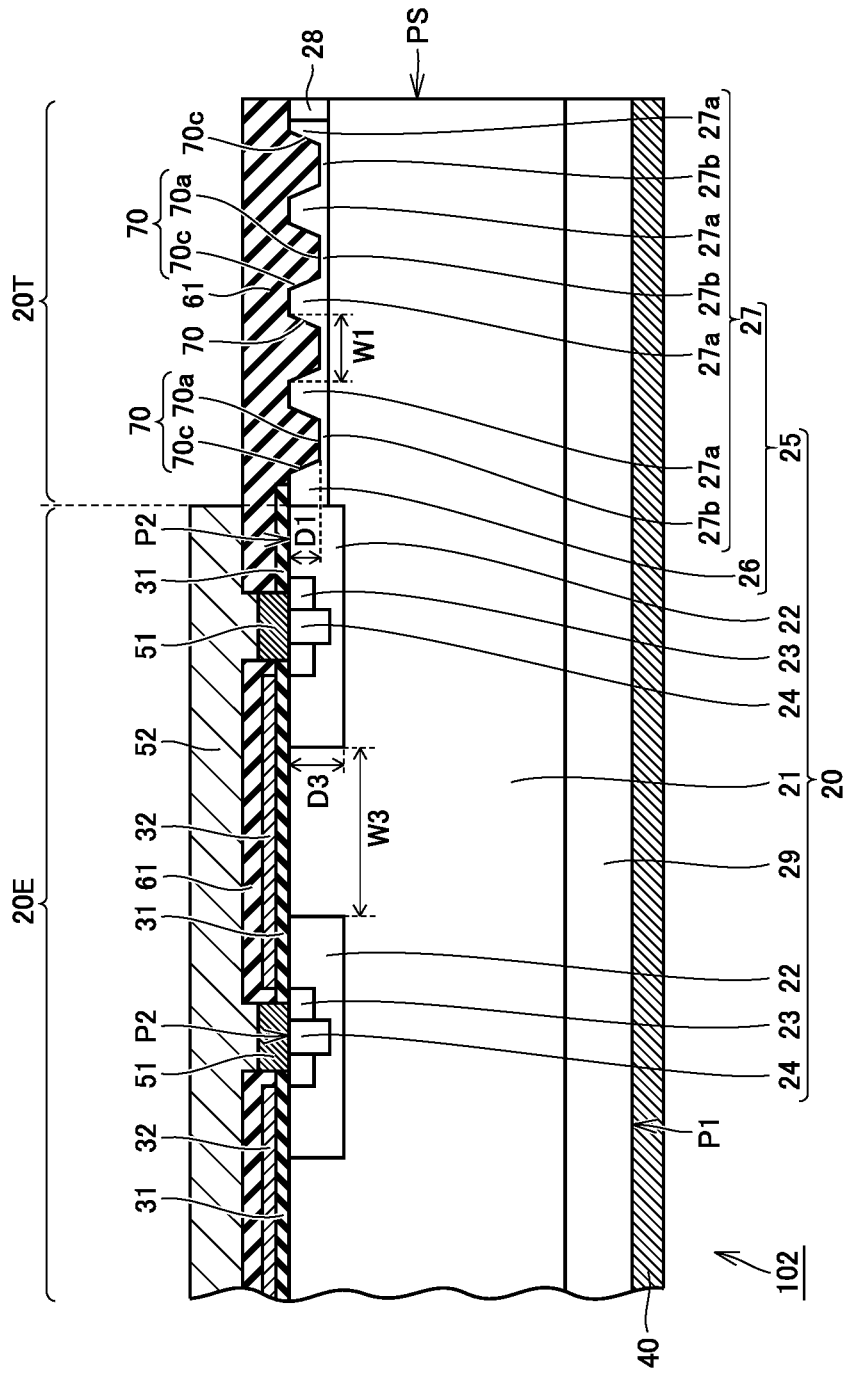
FIG. 17 is a cross-sectional view of a variation of the wide band gap semiconductor device according to the first reference example.

Although each of MOSFETs 101, 102, 103 according to the first embodiment as well as the first and second reference examples is formed as a trench gate type, it may be formed as a planar type. FIG. 17 shows planar type MOSFET 102 according to the first reference example. When the wide band gap semiconductor device is formed as planar type MOSFET 102, width W1 of peripheral region trench 70 in the direction perpendicular to the direction in which peripheral region trench 70 extends is preferably set to be narrower than spacing W3 between body regions 22 facing each other with the JFET region (region located between body regions 22 in drift layer 21) interposed therebetween. In addition, depth D1 of peripheral region trench 70 in the direction perpendicular to upper surface P2 is preferably set to be shallower than depth D3 of the bottom of each body region 22 from upper surface P2. Again in this case, since the width of peripheral region trench 70 is sufficiently narrow, spacing between depletion layers expanding from electric field relaxing regions 25 facing each other with peripheral region trench 70 interposed therebetween toward drift layer 21 can be reduced in the direction perpendicular to the direction in which peripheral region trench 70 extends, or the depletion layers can be readily expanded such that they are connected together while extending over peripheral region trench 70. As a result, electric field concentration in the vicinity of device region 20E and in peripheral region 20T can be relaxed to improve the breakdown voltage of the wide band gap semiconductor device.

In addition, in the methods of manufacturing the wide band gap semiconductor devices according to the first embodiment as well as the first and second reference examples, the order of the steps of forming peripheral region trench 70 and stepped portion 71 in peripheral region 20T and each step of forming the device structure in device region 20E is not limited to the order described above, but may be selected as appropriate.

Although the embodiments of the present invention have been described above, the embodiments described above can be modified in various ways. Further, the scope of the present invention is not limited to the embodiments described above. The scope of the present invention is defined by the terms of the claims, and is intended to include any modifications within the scope and meaning equivalent to the terms of the claims.

ASPECTS

The wide band gap semiconductor devices according to the first embodiment as well as the first and second reference examples described above can also be applied to a semiconductor device made of any semiconductor material.

(2-1) A semiconductor device according to this embodiment includes a semiconductor substrate (epitaxial substrate 20) having a main surface (upper surface P2) and made of silicon (Si) or a wide band gap semiconductor, semiconductor substrate 20 including a device region 20E formed in semiconductor substrate 20, and a peripheral region 20T formed to surround device region 20E. In peripheral region 20T, semiconductor substrate 20 includes a first semiconductor region (drift layer 21) having a first conductivity type, and a second semiconductor region (electric field relaxing region 25) formed on the first semiconductor region (drift layer 21) and having main surface P2, the second semiconductor region having a second conductivity type different from the first conductivity type, and at an outermost periphery of peripheral region 20T, semiconductor substrate 20 includes a stepped portion 71 annularly surrounding device region 20E, and the second semiconductor region is formed along stepped portion 71.

(2-2) In the semiconductor device according to this embodiment, stepped portion 71 may have an upper surface (terrace surface 71a) parallel to the main surface (upper surface P2), and an inclined surface (step surface 71c) with respect to the main surface (upper surface P2), and a thickness T1 of the second semiconductor region on inclined surface 71c (see FIG. 1) may be greater than a thickness T2 of the second semiconductor region (electric field relaxing region 25) on inclined surface 71c (see FIG. 1).

(2-3) In the wide band gap semiconductor device according to this embodiment, a plurality of the stepped portions (71) may be formed, and the plurality of stepped portions (71) may be formed in a step-like manner such that their depth in a direction perpendicular to the main surface (P2) increases as the distance to an outer periphery of the peripheral region (20T) decreases.

(2-4) In the semiconductor device according to this embodiment, a dielectric layer 61 may be formed on stepped portions 71, and the second semiconductor region (electric field relaxing region 25) may be formed to be sandwiched between the first semiconductor region (drift layer 21) and dielectric layer 61 in stepped portions 71.

(2-5) In the semiconductor device according to this embodiment, a material forming the dielectric layer may include at least one selected from the group consisting of silicon dioxide, polyimide, and silicon nitride.

(2-6) In the semiconductor device according to this embodiment, in the peripheral region (20T), a plurality of peripheral region trenches (70) annularly surrounding the device region (20E) may be formed in the main surface (P2) of the second semiconductor region (25) located on an inner side relative to the stepped portions (71).

(2-7) In the semiconductor device according to this embodiment, a bottom (70a) of each of the peripheral region trenches (70) may be located at the second semiconductor region (25) side with respect to an interface between the first semiconductor region (21) and the second semiconductor region (25).

(2-8) In the semiconductor device according to this embodiment, a bottom (70a) of each of the peripheral region trenches (70) may be located at the first semiconductor region (21) side with respect to an interface between the first semiconductor region (21) and the second semiconductor region (25).

(2-9) In the device region of the semiconductor device according to this embodiment, a device trench TR may be provided in the main surface (P2) of the semiconductor substrate, a width of each of peripheral region trenches 70 at the main surface (P2) in a direction perpendicular to a direction in which peripheral region trench 70 extends may be smaller than a width of device trench TR at the main surface (P2) in a direction perpendicular to a direction in which device trench TR extends, and a depth of each of peripheral region trenches 70 in a direction perpendicular to the main surface (upper surface P2) may be smaller than a depth of device trench TR in the direction perpendicular to the main surface (upper surface P2).

(2-10) In the device region of the semiconductor device according to this embodiment, the semiconductor substrate may include the first semiconductor region (drift layer 21) having the main surface (upper surface P2), a pair of third semiconductor regions (body regions 22) spaced apart from and facing each other at main surface P2, the third semiconductor regions having the second conductivity type, and a fourth semiconductor region having the first conductivity type in each of the pair of third semiconductor regions (body regions 22), a width of each of peripheral region trenches 70 at the main surface (P2) in a direction perpendicular to a direction in which peripheral region trench 70 extends may be smaller than spacing between the third semiconductor regions (p body regions 22) facing each other with the first semiconductor region interposed therebetween at main surface P2, and a depth of each of peripheral region trenches 70 in a direction perpendicular to the main surface may be smaller than a depth of a bottom of each of the third semiconductor regions (p body regions 22) from the main surface.

(2-11) In the semiconductor device according to this embodiment, a sidewall of each of peripheral region trenches 70 may be inclined with respect to main surface P2.

(2-12) In the semiconductor device according to this embodiment, the first conductivity type may be n type, and the second conductivity type may be p type.

INDUSTRIAL APPLICABILITY

The present invention is applied particularly advantageously to a semiconductor device required to have a high breakdown voltage.

REFERENCE SIGNS LIST 20 semiconductor substrate; 20E device region; 20T peripheral region; 21 drift layer (first semiconductor region); 22 body region (third semiconductor region); 23 source region (fourth semiconductor region); 24 contact region; 25 electric field relaxing region (second semiconductor region); 27 guard ring region; 27a thick portion; 27b thin portion; 28 field stop region; 29 single-crystal substrate; 31 gate oxide film; 32 gate electrode; 40 drain electrode layer; 50 source electrode layer; 51 ohmic portion; 52 wiring portion; 60 interlayer insulating film; 61 dielectric layer; 70 peripheral region trench; 70a bottom surface; 70c sidewall surface; 71 stepped portion; 71a terrace surface; 71c step surface; 80, 81, 82, 90 mask layer; 101, 102, 103 MOSFET; TR trench; BT bottom surface; SW sidewall surface; P1 lower surface; P2 upper surface (main surface); PS substrate side surface.

The invention claimed is:

1. A wide band gap semiconductor device comprising:
a semiconductor substrate having a main surface and made of a wide band gap semiconductor;
a device region formed in the semiconductor substrate; and
a peripheral region formed to surround the device region,
in the peripheral region, the semiconductor substrate including a first semiconductor region having a first conductivity type, and a second semiconductor region formed on the first semiconductor region and having the main surface, the second semiconductor region having a second conductivity type different from the first conductivity type,
in the peripheral region, the semiconductor substrate having a stepped portion annularly surrounding the device region,
the second semiconductor region being formed along the stepped portion,
wherein a dielectric layer is formed on the stepped portion, and
the second semiconductor region is formed to be sandwiched between the first semiconductor region and the dielectric layer in the stepped portion.

2. The wide band gap semiconductor device according to claim 1, wherein
the stepped portion has an upper surface extending in a direction along the main surface, and an inclined surface with respect to the main surface, and
a thickness of the second semiconductor region on the upper surface is greater than a thickness of the second semiconductor region on the inclined surface.

3. The wide band gap semiconductor device according to claim 1, wherein
a plurality of the stepped portions are formed, and
the plurality of stepped portions are formed in a step-like manner such that their depth in a direction perpendicular to the main surface increases as the distance to an outer periphery of the peripheral region decreases.

4. The wide band gap semiconductor device according to claim 1, wherein
a material forming the dielectric layer is at least one selected from the group consisting of silicon dioxide, polyimide, and silicon nitride.

5. The wide band gap semiconductor device according to claim 1, wherein
in the peripheral region, a plurality of peripheral region trenches annularly surrounding the device region are formed in the main surface of the second semiconductor region located on an inner side relative to the stepped portion.

6. The wide band gap semiconductor device according to claim 5, wherein
a bottom of each of the peripheral region trenches is located at the second semiconductor region side with respect to an interface between the first semiconductor region and the second semiconductor region.

7. The wide band gap semiconductor device according to claim 5, wherein
a bottom of each of the peripheral region trenches is located at the first semiconductor region side with respect to an interface between the first semiconductor region and the second semiconductor region.

8. The wide band gap semiconductor device according to claim 5, wherein
in the device region, a device trench is provided in the main surface of the semiconductor substrate,
a width of each of the peripheral region trenches at the main surface in a direction perpendicular to a direction in which the peripheral region trench extends is smaller than a width of the device trench at the main surface in a direction perpendicular to a direction in which the device trench extends, and
a depth of each of the peripheral region trenches in the direction perpendicular to the main surface is smaller than a depth of the device trench in the direction perpendicular to the main surface.

9. The wide band gap semiconductor device according to claim 5, wherein
in the device region, the semiconductor substrate includes a first impurity region having the first conductivity type, a pair of third semiconductor regions spaced apart from and facing each other at the main surface, the third semiconductor regions having the second conductivity type, and a fourth semiconductor region having the first conductivity type in each of the pair of third semiconductor regions, and a width of each of the peripheral region trenches at the main surface in a direction perpendicular to a direction in which the peripheral region trench extends is smaller than spacing between the third semiconductor regions facing each other with the first semiconductor region interposed therebetween at the main surface, and a depth of each of the peripheral region trenches in the direction perpendicular to the main surface is smaller than a depth of a bottom of each of the third semiconductor regions from the main surface.

10. The wide band gap semiconductor device according to claim 5, wherein
a sidewall of each of the peripheral region trenches is inclined with respect to the main surface.

11. The wide band gap semiconductor device according to claim 1, wherein
the first conductivity type is n type, and the second conductivity type is p type.

* * * * *